US009984190B1

(12) United States Patent
Aurich et al.

(10) Patent No.: US 9,984,190 B1
(45) Date of Patent: May 29, 2018

(54) SYSTEMS AND METHODS FOR DETERMINING PARAMETERS OF A POWER MOSFET MODEL

(71) Applicant: Ansys, Inc., Canonsburg, PA (US)

(72) Inventors: Joachim Aurich, Berlin (DE); Shimeng Huang, Bridgeville, PA (US); Sameer Kher, Mars, PA (US); Torsten Fichtner, Pittsburgh, PA (US)

(73) Assignee: Ansys, Inc., Canonsburg, PA (US)

( * ) Notice: Subject to any disclaimer, the term of this patent is extended or adjusted under 35 U.S.C. 154(b) by 0 days. days.

(21) Appl. No.: 15/220,563

(22) Filed: Jul. 27, 2016

Related U.S. Application Data

(60) Provisional application No. 62/198,332, filed on Jul. 29, 2015.

(51) Int. Cl.
*G06F 17/50* (2006.01)
(52) U.S. Cl.
CPC ................ *G06F 17/5036* (2013.01)
(58) Field of Classification Search
CPC ...... G06F 11/36; G06F 9/455; G06F 11/3447; G06F 17/5009; G06F 17/5036; G06F 17/5045; G06F 2217/63; G06F 2217/78
USPC ...................... 703/13–14; 716/106–107, 136
See application file for complete search history.

(56) References Cited

U.S. PATENT DOCUMENTS

2008/0127005 A1* 5/2008 Lin .................... G06F 17/5036
716/115
2016/0048622 A1* 2/2016 Jeon .................... G06F 17/5036
703/14

* cited by examiner

*Primary Examiner* — Paul Dinh
(74) *Attorney, Agent, or Firm* — Jones Day

(57) ABSTRACT

Systems and methods are provided for determining parameters of a power MOSFET model. First data related to characteristics of a semiconductor device in a steady-state operation and second data related to transient-response characteristics of the device are received. Variables of one or more functions are fit to the first data to determine static parameters of a power MOSFET model. A computer simulation is executed to determine transient-response characteristics of the model as configured with a current set of dynamic parameters, where the simulation generates a set of values indicative of the model's transient-response characteristics. An error value indicating a difference between the set of values and the second data is determined. Based on a determination that the error value is greater than the threshold, values of the current set of dynamic parameters are adjusted based on the error value and results of computer simulations.

21 Claims, 28 Drawing Sheets

| NO. | PARAMETER | SYMBOL | MEANING |
|---|---|---|---|
| 1 | CIN0 | $C_{IN0}$ | OFF SWITCH INPUT CAPACITANCE |
| 2 | CIN1 | $C_{IN1}$ | ON SWITCH INPUT CAPACITANCE |
| 3 | CR0 | $C_{R0}$ | OFF SWITCH FEEDBACK CAPACITANCE |
| 4 | CR1 | $C_{R1}$ | ON SWITCH FEEDBACK CAPACITANCE |
| 5 | DELTACR0 | $\delta_{R0}$ | OFF SWITCH CAPACITANCE MINIMUM FACTOR |
| 6 | DELTACR1 | $\delta_{R1}$ | ON SWITCH CAPACITANCE MINIMUM FACTOR |
| 7 | TAUFD | $\tau_{FD}$ | AMBIPOLAR LIFE TIME OF THE FREE WHEEL DIODE JUNCTION |
| 8 | SF | SF | SOFT FACTOR |
| 9 | TAUS | $\tau_S$ | STORAGE TIME CONSTANT |
| 10 | TAUTAIL | $\tau_T$ | TAIL CURRENT TIME CONSTANT |
| 11 | DELTATAIL | $\delta_T$ | TAIL CURRENT MAGNITUDE |
| 12 | RG | $R_G$ | INTERNAL GATE RESISTANCE |
| 13 | DAMPING | d | OSCILLATION IMMUNITY CONSTANT |

Fig. 4

| STEP | DEVICE CHARACTERISTICS FITTED | PARAMETERS EXTRACTED | PARAMETER TYPE |
|---|---|---|---|
| 1 | TRANSFER CHARACTERISTICS | $V_P$, K, $N_{FET}$, AND THEIR TEMPERATURE COEFFICIENTS | STATIC |
| 2 | OUTPUT CHARACTERISTICS | RD0, RD1, RDV, $M_{FET}$, $A_{FET}$, KLM, AND THEIR TEMPERATURE COEFFICIENTS | STATIC |
| 3 | DIODE FORWARD CHARACTERISTICS | $M_F$, $I_{SAID}$, $R_B$ AND THEIR TEMPERATURE COEFFICIENTS | STATIC |
| 4 | THERMAL CHARACTERISTICS | RT1-4, CT1-4, RD1-4, CD1-4 | STATIC |
| 5 | SWITCHING TIME AND ENERGY | CIN0, CIN1, CR0, CR1, DAMPING, TAUF0, TAUTAIL, DELTATAIL, TAUS, RG AND THEIR WORKING POINT COEFFICIENTS | DYNAMIC |

| NO. | MODEL NAME | SETTINGS |
|---|---|---|
| 1 | CIN | IF CIN0=CIN1=CIN is zero an internal value is calculated to find an initial guess for CIN depending on VNOM, INOM and TNOM. Else take a from the data sheet from the input high frequency capacity $C_{in}$. This capacity is almost constant in respect to the collector emitter voltage. If a $C_{in}(V)$ characteristic is given take the (lower) saturation capacity for higher $V_{CE}$. |
| 2 | CR | IF CR0=CR1=CR is zero then according to the shape of $C_R(V)$ (constant or voltage depended) a certain percentage of CIN is applied to CR. In case of voltage dependency it is 20% and for constant capacitance it is set to 2% of CIN. Else take from data sheet the HF zero voltage feedback capacity or reverse capacity $C_R$ if a $C(V)$ plot is available. Otherwise take the given single feedback capacity values for approximately $V_{CE}=(20...25)V$. CR must not exceed 20% of CIN. Otherwise set CR to 20% of CIN. |
| 3 | DELTAC | DELTACR0=DELTACR1=DELTAC is a percentage of the CR value at strong depletion. In case of a $C_R(V)$ function it is set to 0.1, otherwise DELTAC=1 selects a constant feedback capacitance. |
| 4 | TAUFD | PN-junctions which show excess carrier storage get an initial value of 200ns. For Shottky junction this effect is not present and thus the initial value is much smaller TAUFD=10n. Although diffusion charge storage doesn't take place the TAUFD parameter allows to control the remaining reverse recovery which is basically only the discharging of the depletion capacitance. |

| | | |
|---|---|---|
| 5 | SF | The soft factor of the reverse recovery current is set to 2. |
| 6 | TAUS | TAUS controls the storage time measured at the off switch load current edge. For silicon devices having pn-junctions this value is 250ns and depend in addition on the wave form edge acquisition. For SiC devices with majority carrier current it is as small as 10ns. |
| 7 | DELTATAIL TAUTAIL | Majority carrier devices have generally TAUTAIL=0 and DELTATAIL=0 because they don't show current tails. Generally these parameters are intended to control the shape and duration of the load current off switch edge. Minority carrier devices get TAUTAIL=0.3·TAUS and DELTATAIL=0.3. |
| 8 | RG | The internal gate resistance can be calculated internally or takes the value which was provided. The internal calculation takes place for RG=0 and results in RG=(RG_ON+RG_OFF)/4. RG_ON and RG_OFF are the external gate resistances of the reference application. |
| 9 | DAMPING | It is set to 1. |

Fig. 8B

| NO. | PARAMETER TO CHANGE | FITTING GOAL |
|---|---|---|
| 1 | CIN0 | E_ON, E_OFF |
| 2 | CIN1 | t_ON |
| 3 | TAUS | t_OFF |
| 4 | CR0 | t_ON, t_OFF |
| 5 | CR1 | t_ON, t_OFF |
| 6 | TAUFD | E_ON |
| 7 | DAMPING | E_OFF |
| 8 | RG | t_ON |
| 9 | L_EXTERN | E_ON, E_OFF |

| | T | I | V |
|---|---|---|---|
| nom | nom | nom | nom |
| dI | $I_{NOM} \pm \Delta I$ | nom | nom |
| pI | nom | $I_{NOM} + \Delta I$ | nom |
| nI | nom | $I_{NOM} - \Delta I$ | nom |
| pV | nom | nom | $V_{NOM} + \Delta V$ |
| nV | nom | nom | $V_{NOM} - \Delta V$ |

Fig. 15

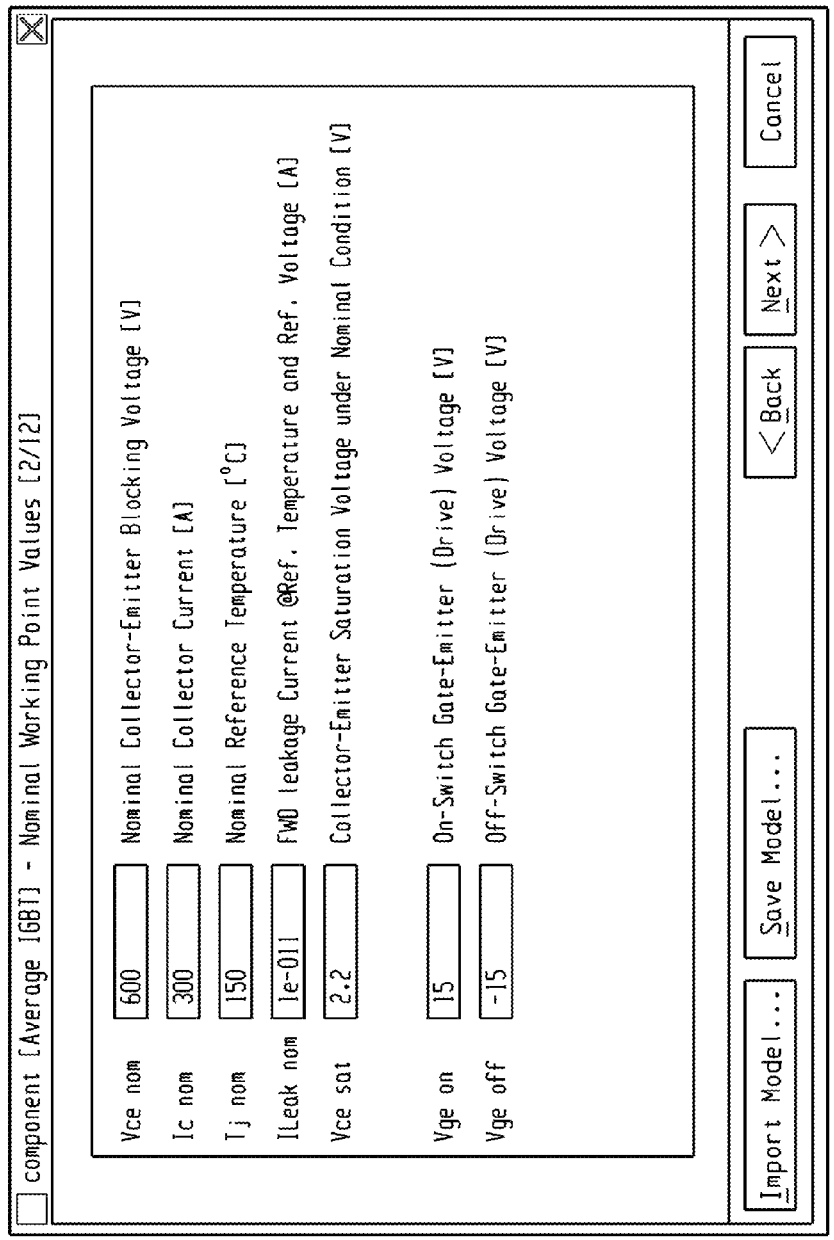
Fig. 17D1

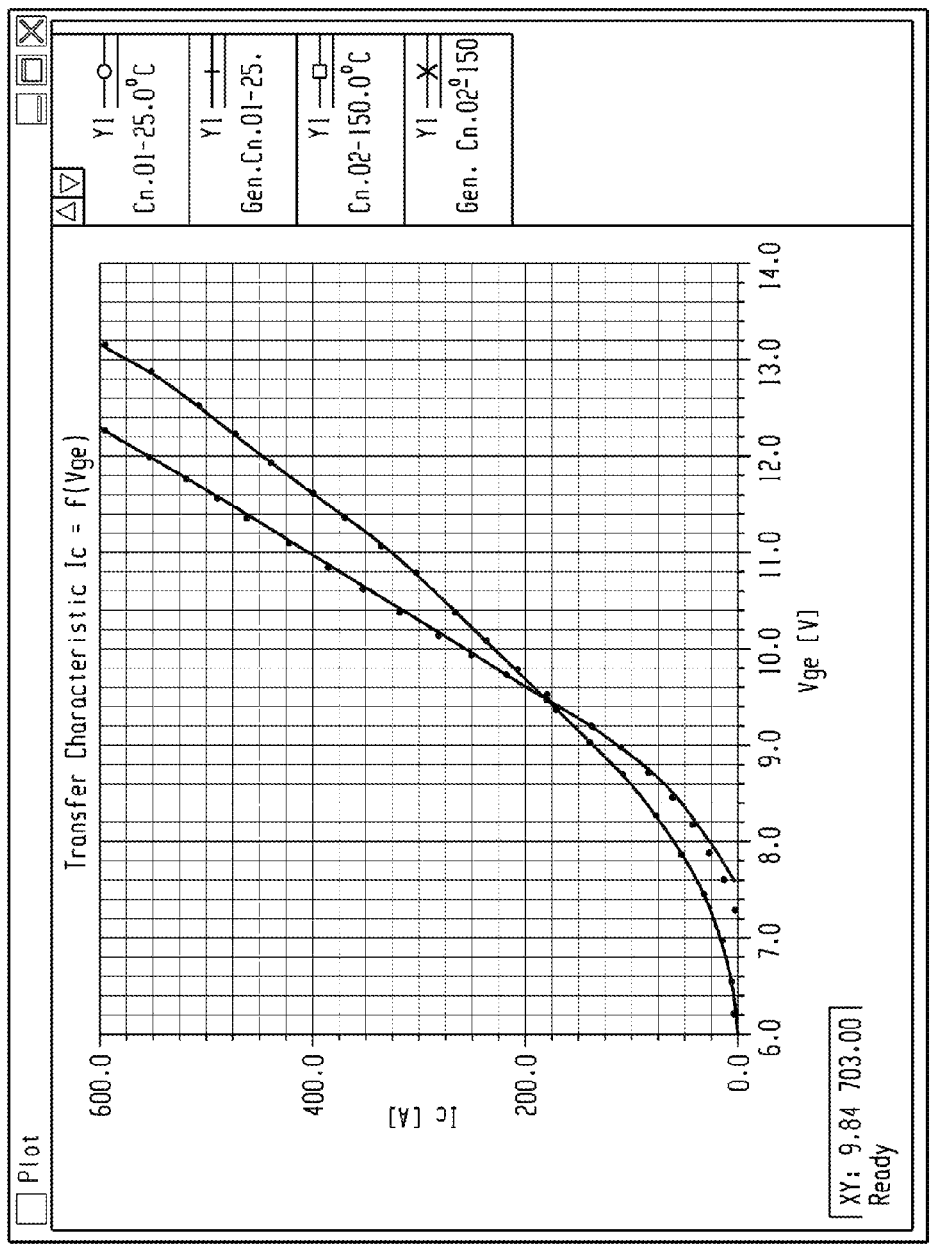
Fig. 17E2

Dynamic Model Input [10/12]

| | Tj [°C] | Vds [V] | Id [A] | Eon [mJ] | Wei... Eon | Eoff [mJ] | Wei... Eoff | Ton [ns] | Wei... Ton | Toff [ns] | Wei... Toff | Res [%] | Ena... | Notes |
|---|---|---|---|---|---|---|---|---|---|---|---|---|---|---|
| | | | | | | | | | | | | | | Select Goals |
| N... | 25 | 800 | 20 | 0.53 | 1 | 0.32 | 1 | 30.8 | 1 | 97.6 | 1 | 5 | ☑ | Nominal Values |
| dT | 0 | 800 | 20 | 0 | 1 | 0 | 1 | 0 | 1 | 0 | 1 | 5 | ☐ | Data at different Tj |
| nV | 25 | 0 | 20 | 0 | 1 | 0 | 1 | 0 | 1 | 0 | 1 | 5 | ☐ | Data at Vds smaller than nomi... |
| pV | 25 | 0 | 20 | 0 | 1 | 0 | 1 | 0 | 1 | 0 | 1 | 5 | ☐ | Data at Vds larger than nomi... |
| nI | 25 | 800 | 0 | 0 | 1 | 0 | 1 | 0 | 1 | 0 | 1 | 5 | ☐ | Data at Id smaller than nomi... |
| pI | 25 | 800 | 0 | 0 | 1 | 0 | 1 | 0 | 1 | 0 | 1 | 5 | ☐ | Data at Id larger than nomi... |

Dynamic Parameter Extraction

[Adv. Settings] [Measurement] [Show Log] [Extraction]

[Import Model...] [Save Model...]     [<Back] [Next>] [Cancel]

*Fig. 17F*

SYSTEMS AND METHODS FOR DETERMINING PARAMETERS OF A POWER MOSFET MODEL

CROSS-REFERENCE TO RELATED APPLICATIONS

This application claims priority to U.S. Provisional Patent Application No. 62/198,332, filed Jul. 29, 2015, entitled "Systems and Methods for Determining Parameters of a Power MOSFET Model," which is incorporated herein by reference in its entirety.

FIELD

This disclosure is related generally to computer-aided design and more particularly to systems and methods for determining parameters of a power metal oxide semiconductor field-effect transistor (MOSFET) model.

BACKGROUND

Power MOSFETs are increasingly popular due to their high input impedance and low gate signal power requirements. Because power MOSFETs are majority carrier devices, they do not suffer from minority carrier storage time effects and therefore offer fast switching speeds. Power MOSFETs also have lower switching losses and simplified gate drive requirements as compared to their insulated-gate bipolar transistor (IGBT) counterparts. Silicon (Si) MOSFETs are the most widely-used low-voltage switches and can be found in most power supplies, DC to DC converters, and low voltage motor controllers. The emerging silicon carbide (SiC) power MOSFETs have much higher breakdown voltage and much lower onstate resistance, as compared to Si power MOSFETs. SiC MOSFETs now find use in high-voltage and high-power converter systems, among others.

To predict the performance of systems including power MOSFETs, computer-based simulations may be utilized. Such simulations include a power MOSFET model. When the power MOSFET model is configured with suitable parameters, the model performs in a manner similar to a real-world power MOSFET. Thus, by using a properly parameterized power MOSFET model, a system including one or more power MOSFETs can be designed and tested via computer simulations prior to building the system in hardware.

SUMMARY

Systems, methods, and non-transitory computer-readable storage mediums are provided for determining parameters of a power MOSFET model. In an example computer-implemented method for determining parameters of a power MOSFET model, data for a semiconductor device is received. The data includes (i) first data related to characteristics of the device in a steady-state operation, and (ii) second data related to transient-response characteristics of the device. Variables of one or more functions are fit to the first data to determine static parameters of a power MOSFET model. A computer simulation is executed to determine transient-response characteristics of the model as configured with the static parameters and a current set of dynamic parameters, where the simulation generates a set of values indicative of the model's transient-response characteristics. An error value indicating a difference between the set of values and the second data is determined. Based on a determination that the error value is less than or equal to a threshold, dynamic parameters of the model are set equal to the current set of dynamic parameters. Based on a determination that the error value is greater than the threshold, for each of the dynamic parameters of the model, a set of computer simulations is executed in which a value of the dynamic parameter in the model is varied over the set of simulations while holding constant values of other dynamic parameters in the model. Based on the determination that the error value is greater than the threshold, values of the current set of dynamic parameters are adjusted based on the error value and results of the sets of computer simulations.

An example computer-implemented system for determining parameters of a power MOSFET model includes a processing system and computer-readable memory in communication with the processing system encoded with instructions for commanding the processing system to execute steps. In executing the steps, data for a semiconductor device is received. The data includes (i) first data related to characteristics of the device in a steady-state operation, and (ii) second data related to transient-response characteristics of the device. Variables of one or more functions are fit to the first data to determine static parameters of a power MOSFET model. A computer simulation is executed to determine transient-response characteristics of the model as configured with the static parameters and a current set of dynamic parameters, where the simulation generates a set of values indicative of the model's transient-response characteristics. An error value indicating a difference between the set of values and the second data is determined. Based on a determination that the error value is less than or equal to a threshold, dynamic parameters of the model are set equal to the current set of dynamic parameters. Based on a determination that the error value is greater than the threshold, for each of the dynamic parameters of the model, a set of computer simulations is executed in which a value of the dynamic parameter in the model is varied over the set of simulations while holding constant values of other dynamic parameters in the model. Based on the determination that the error value is greater than the threshold, values of the current set of dynamic parameters are adjusted based on the error value and results of the sets of computer simulations.

An example non-transitory computer-readable storage medium for determining parameters of a power MOSFET model includes computer executable instructions which, when executed, cause a processing system to execute steps. In executing the steps, data for a semiconductor device is received. The data includes (i) first data related to characteristics of the device in a steady-state operation, and (ii) second data related to transient-response characteristics of the device. Variables of one or more functions are fit to the first data to determine static parameters of a power MOSFET model. A computer simulation is executed to determine transient-response characteristics of the model as configured with the static parameters and a current set of dynamic parameters, where the simulation generates a set of values indicative of the model's transient-response characteristics. An error value indicating a difference between the set of values and the second data is determined. Based on a determination that the error value is less than or equal to a threshold, dynamic parameters of the model are set equal to the current set of dynamic parameters. Based on a determination that the error value is greater than the threshold, for each of the dynamic parameters of the model, a set of computer simulations is executed in which a value of the dynamic parameter in the model is varied over the set of simulations while holding constant values of other dynamic parameters in the model. Based on the determination that the error value is greater than the threshold, values of the current set of dynamic parameters are adjusted based on the error value and results of the sets of computer simulations.

BRIEF DESCRIPTION OF THE DRAWINGS

FIG. 4 is a table listing example dynamic parameters of a power MOSFET model.

FIG. 6 is a table listing steps used in an example model parameter extraction procedure.

FIG. 8 is a table including initial estimates for dynamic parameters of a power MOSFET model.

FIG. 15 depicts a user interface (UI) that enables a user to specify a material for a power MOSFET model.

FIGS. 17D-17K illustrate aspects of an exemplary user interface (UI) that may be used with the systems and methods described herein.

DETAILED DESCRIPTION

Engineers who work with power MOSFETS often require an accurate simulation model of a specific off-the-shelf device. It can be difficult and costly to parameterize a generic MOSFET model with sufficient detail. This is because the generic model usually involves hundreds of parameters and requires material- and structure-related data only available to semiconductor device manufactures. To address these problems, the systems and methods described herein implement a power MOSFET model and a parameter extraction procedure for determining parameters of the model. As described in further detail below, the parameter extraction procedure requires only data from a datasheet, in an example. The model and parameter extraction procedure described herein are technology independent, meaning that they are not specific to a certain semiconductor material, structure, or manufacturing technology and thus can be applied to various MOSFETs from different manufacturers. As noted above, the parameter extraction procedure may be based on datasheet values only, meaning that all information needed to parameterize the model may be found in a datasheet and that there is no need for additional material- or structure-related data.

Figure 1A:
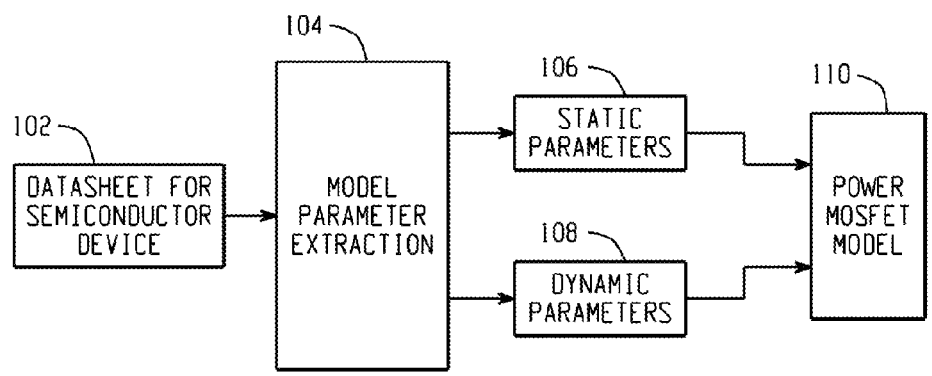
FIG. 1A is a block diagram depicting an extraction of static and dynamic parameters of a power MOSFET model from a semiconductor device datasheet.

To illustrate example features of the systems and methods described herein, reference is made to FIG. 1A. In this figure, a model parameter extraction procedure 104 is applied to a datasheet 102 for a semiconductor device. The datasheet 102 may be a conventional datasheet provided by a manufacturer of the semiconductor device. The semiconductor device may be a power MOSFET. Specifically, the datasheet 102 may include first data related to characteristics of the device in a steady-state operation and second data related to transient-response characteristics of the device (e.g., switching characteristics of the device, relating to an energy loss in switching the device from a first state to a second state and/or an amount of time required in switching the device from the first state to the second state). The first data includes, in an example, (i) a transfer curve defining a transfer characteristic of the device, (ii) an output curve defining an output characteristic of the device, (iii) a diode curve defining a diode characteristic of the device, and (iv) a thermal curve defining a thermal characteristic of the device. The second data from the datasheet 102 includes, in an example, (i) an $E_{ON}$ value representing an energy loss in switching the device from an off state to an on state, (ii) an $E_{OFF}$ value representing an energy loss in switching the device from the on state to the off state, (iii) a $T_{ON}$ value representing a time elapsed in switching the device from the off state to the on state, and (iv) a $T_{OFF}$ value representing a time elapsed in switching the device from the on state to the off state. The first and second data noted above is exemplary only, and other types of first and second data may be included in the datasheet 102 in other examples.

The application of the model parameter extraction procedure 104 to the first and second data of the datasheet 102 enables static parameters 106 and dynamic parameters 108 of a power MOSFET model 110 to be determined. The model parameter extraction procedure 104 is thus used to parameterize the generic MOSFET model 110 using only data from the datasheet 102. In this example, the static and dynamic parameters 106, 108 of the power MOSFET model 110 are determined using only the data from the datasheet 102, and material-related and structure-related data are not used in determining the static and dynamic parameters 106, 108. When the power MOSFET model 110 is configured with the static parameters 106, as properly determined using the model parameter extraction procedure 104, the model 110 has characteristics in a steady-state operation (e.g., non-switching mode of operation) that correspond to those of the semiconductor device. For example, when the model 110 is configured with the static parameters 106, the model 110 may have transfer characteristics, output characteristics, diode forward characteristics, and thermal characteristics that correspond to those of the semiconductor device. Such characteristics are described in further detail below.

When the model 110 is configured with the dynamic parameters 108, as properly determined using the model parameter extraction procedure 104, the model 110 has transient-response characteristics (e.g., switching characteristics) that correspond to those of the semiconductor device. For example, when the model 110 is configured with the dynamic parameters 108, the model 110 may be used in generating simulated switching waveforms that show dynamic behavior such as voltage and current overshoot, and the switching time and energy measured from the simulation results may match values from the datasheet 102. For power semiconductor devices, switching losses account for a large portion of the total losses of the device and are a nonlinear function of current, voltage, and device parasitics. Thus, the proper parameterizing of the model 110, which causes the model 110 to exhibit switching performance that mimics real-world power semiconductor devices, may enable the model 110 to be used in accurately estimating characteristics (e.g., switching losses, switching time, etc.) of a device or system including such power semiconductor devices.

The parameterizing of the model 110 using the parameters 106, 108 extracted via the model parameter extraction procedure 104 may further enable the model 110 to exhibit thermal behavior and working point dependency characteristics that correspond to those of the semiconductor device. As described below, the model 110 utilizes a standard 4-order thermal network model from junction to case to model the thermal behavior of the semiconductor device, in an example. The model 110 utilizes working point coefficients to model the working point dependency of the semiconductor device (e.g., usually MOSFET dynamic waveforms depend on the MOSFET's working point values, such as load current blocking voltage, temperature, and drive condition), in an example.

Figure 1B:
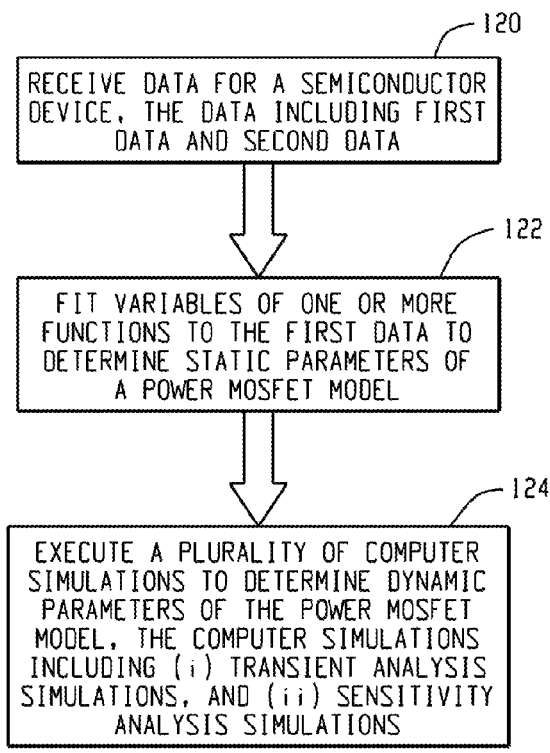
FIG. 1B is a flow diagram illustrating high-level steps of an example method for determining parameters of a power MOSFET model.

The model parameter extraction procedure 104 is described in further detail below. To illustrate high-level features of the model parameter extraction procedure 104, reference is made to FIG. 1B. This figure is a flowchart illustrating high-level steps of an exemplary computer-implemented method for determining parameters of a power MOSFET model. At 120, data for a semiconductor device is received, the data including (i) first data related to characteristics of the device in a steady-state operation, and (ii) second data related to transient-response characteristics of the device. In an example, the data for the semiconductor device includes only data from a datasheet for the device. At 122, variables of one or more functions are fit to the first data to determine static parameters of a power MOSFET model. In an example, the one or more functions include (i) an equation for calculating a current across the nonlinear resistance $R_{NL}$ included in the model 110, and (ii) equations of a Schichman-Hodges model. The nonlinear resistance $R_{NL}$ and the aforementioned equations are described in further detail below. At 122, a plurality of computer simulations are executed to determine dynamic parameters of the power MOSFET model, where the computer simulations include (i) transient analysis simulations, and (ii) sensitivity analysis simulations. Such transient analysis and sensitivity analysis simulations are described in further detail below.

Additionally, disclosed herein are systems and methods for developing accurate simulations for silicon carbide (SiC) power MOSFETs. SiC power MOSFETs differ in various ways from conventional silicon (Si) power MOSFETs, and thus, the simulation models described herein for SiC power MOSFETs include features specifically designed to account for such differences. These features are described in detail below. It is noted that the techniques of the instant disclosure have a much broader range of applicability than the particular embodiments described herein. Thus, although embodiments described herein are directed to systems and methods for developing accurate simulations of power MOSFET devices, including SiC power MOSFET devices, the techniques of the instant disclosure are not limited to this context. Rather, the techniques described herein are usable in the context of a wide variety of devices (e.g., power electronic devices, such as thyristors, JFETs, BJTs, IGBTs, diodes, etc.).

Figure 2:
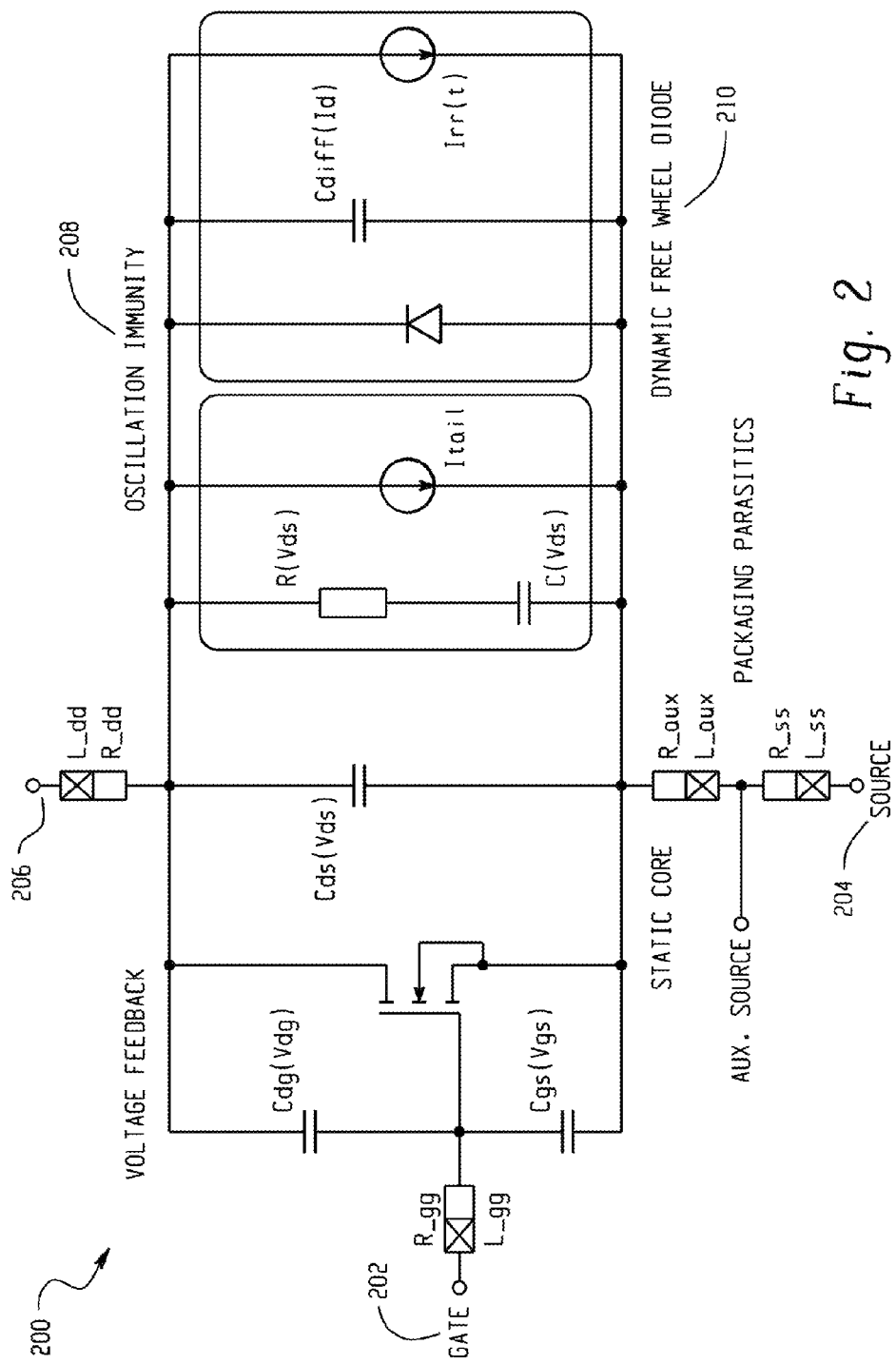
FIG. 2 depicts a power MOSFET model subcircuit.

FIG. 2 depicts a model subcircuit 200 for an example power MOSFET model. Determining the static and dynamic parameters of the power MOSFET model (e.g., using the model parameter extraction methods described below) enables the model subcircuit 200 to perform in a manner that is similar to that of a real-world semiconductor device. The model subcircuit 200, configured with the determined static and dynamic parameters, can subsequently be used in computer simulations including other components and circuitry.

The model subcircuit 200 includes a static core model and additional components for dynamic modeling. More specifically, and as illustrated in FIG. 2, the model subcircuit 200 includes gate, source, and drain terminals 202, 204, 206 of the power MOSFET model. In the model subcircuit 200, an intrinsic body diode is formed in the body-drain p-n junction connected between drain and source terminals 204, 206. The body diode is represented in the model subcircuit 200 by the dynamic free wheel diode 210. Additionally, in the power MOSFET model, to damp the oscillations that may occur in the system, additional damping resistance R(Vds) is used in the model. The model subcircuit 200 depicts the damping resistance R(Vds) and related components in oscillation immunity section 208. Switching characteristics of the power MOSFET model (also referred to herein as "dynamic behavior" of the power MOSFET model) may be highly dependent on parasitic (i.e., intrinsic) resistances and capacitances of the model. Such parasitic resistances and capacitances are represented in the model subcircuit 200 by the gate, source, and drain resistances, the gate-source capacitance, the drain-gate capacitance, and the drain-source capacitance. Additional details regarding the model subcircuit 200 are included in "A new power MOSFET model and an easy to use characterization tool using device datasheet," Fang Wang, et al., 2013 IEEE 14th Workshop on Control and Modeling for Power Electronics (COMPEL), which is incorporated herein by reference in its entirety.

As noted above, the power MOSFET model described herein includes a static core model and additional components for dynamic modeling. The static model of the FET is modeled using a Schichman-Hodges model, and is described by the following equations:

Saturation voltage:

$$V_{SAT} = A_{FET}(T)[V_{GS} - V_P(T)]^{M_{FET}(T)} \qquad \text{(Equation 1)}$$

Saturation current:

$$I_{SAT} = \frac{K(T)}{2}[V_{GS} - V_P(T)]^{N_{FET}(T)} \qquad \text{(Equation 2)}$$

$VDS < VSAT$:

$$I_D = I_{SAT}(1 + KLM \cdot V_{DS})\left(2 - \frac{V_{DS}}{V_{SAT}}\right)\left(\frac{V_{DS}}{V_{SAT}}\right) \quad \text{(Equation 3)}$$

$VDS \geq VSAT:$ $$I_D = I_{SAT}(1 + KLM \cdot V_{DS}) \quad \text{(Equation 4)}$$

where $V_p(T)$ is the pinch-off voltage, $A_{FET}(T)$ is the saturation factor, $M_{FET}(T)$ is the saturation exponent, $N_{FET}(T)$ is the exponent of transfer characteristics, KLM is a channel modulation factor, and K(T) is a coefficient, all with temperature T dependence. These values are static parameters of the power MOSFET model, the determination of which is described below.

Figure 3A:
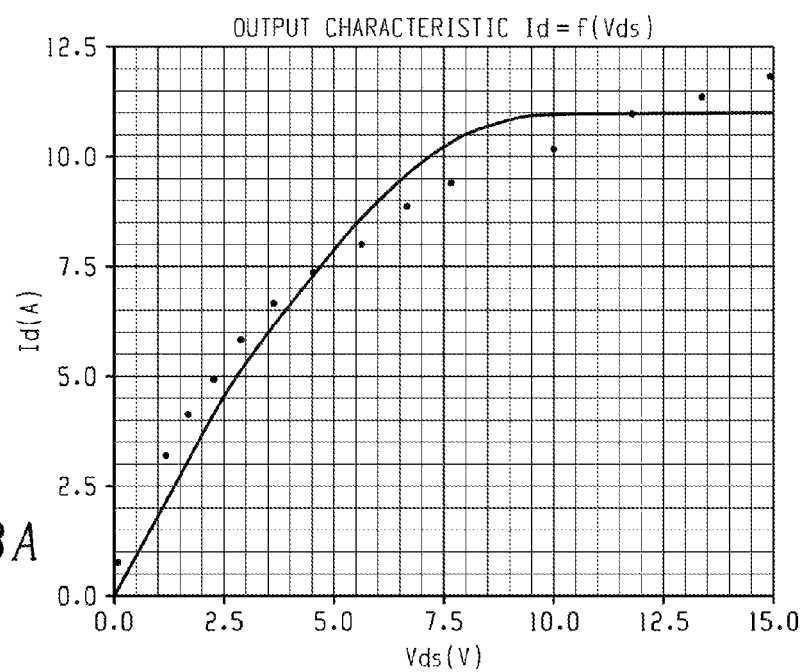
FIGS. 3A and 3B depict example output characteristics of power MOSFET models.

The Schichman-Hodges model shows distinct linear and saturation regions on drain current when voltage across the device increases. However, such distinct linear and saturation regions on drain current are not usually present in SiC MOSFETs. Instead, SiC MOSFETs generally exhibit an increase in current with drain bias due to channel length modulation. As a result, the SiC MOSFET's output characteristics curves have no clear turning point from linear to saturation, and $I_D$ continues to rise with $V_{DS}$ instead of going flat. With the conventional Schichman-Hodges model, large static fitting error may result when using this conventional model to model SiC MOSFETs. FIG. 3A shows an example of the large fitting error.

Figure 3B:
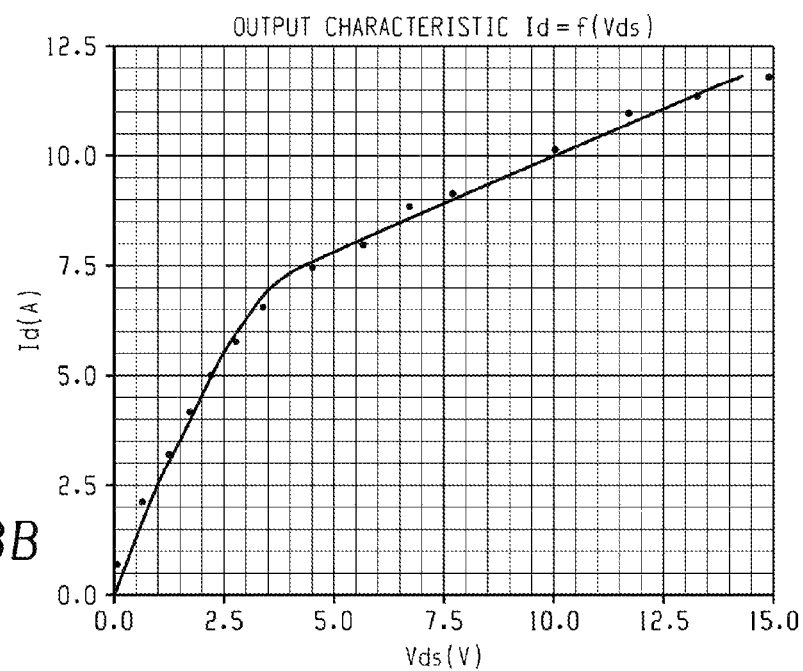

In order to more accurately model parameters of SiC MOSFETs, the MOSFET model disclosed herein extends the conventional Schichman-Hodges model. Specifically, to model the behavior of channel length modulation, and thereby model SiC MOSFETs, the model is extended using a nonlinear resistance $R_{NL}$ at the internal drain terminal of the model. Its nonlinear I-V relationship is described by:

$$I(V) = \frac{RDV}{RD0} \tanh\left(\frac{V}{RDV}\right) + \frac{V}{RD1} \quad \text{(Equation 5)}$$

where I is the current through the nonlinear resistance $R_{NL}$, V is the voltage across $R_{NL}$, and RD0, RD1, and RDV are static parameters of the MOSFET model. With the addition of $R_{NL}$, the static model can fit much better to the output characteristics of a SiC MOSFET, as shown in FIG. 3B. In this figure, a significantly reduced fitting error results from using the model including the nonlinear resistance $R_{NL}$.

As described above, in a power MOSFET, an intrinsic body diode is formed in the body-drain p-n junction connected between drain and source terminals. In the power MOSFET model described herein, the body diode is modeled as a simple diode in series with a current-dependent resistor. The static current of the diode and the series resistance is given by the following equations:

$$I_F = I_{SATD}\left[\exp\left(\frac{V_F}{M_F \cdot V_T}\right) - 1\right] \quad \text{(Equation 6)}$$

$$R_{BULK} = \frac{R_B}{\sqrt{1 + \frac{I_F}{I_{NOM}}}} \quad \text{(Equation 7)}$$

In Equation 7, $I_{NOM}$ represents the nominal current at which the device operates and is used as a normalizing value in the equation. The parameters $M_F$, $I_{SATD}$, and $R_B$ are used to model the diode, and they are temperature dependent. These parameters comprise static parameters of the power MOSFETs model, the determination of which is described below. $V_F$ is the voltage over the diode, and $$V_T = \frac{K_B T}{q},$$

where $K_B$ is the Boltzmann constant, and q is the electron charge.

In addition to the static core and body diode features of the power MOSFET model, the model includes additional components for dynamic modeling (i.e., modeling a switching behavior of the power MOSFET device). The MOSFET dynamic model is built around the static model with lumped passive elements and current sources. FIG. 4 is a table listing parameters used in the dynamic model. These parameters are described in further detail below. All capacitances between the terminals are modeled with a capacitor that includes both a depletion capacitance behavior and an enhancement capacitance behavior. $C_{GS}$ is modeled using CIN0 and CIN1, while $C_{DG}$ is modeled using CR0 and CR1. This approach allows for greater flexibility in modeling the on and off switching behavior. Special care is taken to avoid numerically induced charge when the capacitance values are switched. The curves remain differentiable at the transition from one region to the other. This transition happens when the voltage across the junction $V_{JNCT}=0$.

For positive values of $V_{JNCT}$ (enhancement region), the capacitance is:

$$C(V_{JNCT}) = C_0\left[1 + (BETA - 1)\left(1 - e^{\frac{-V_{JNCT} \cdot ALPHA \cdot (1-DELTA)}{(BETA-1) \cdot V_{DIFF}}}\right)\right] \quad \text{(Equation 8)}$$

At negative values of $V_{JNCT}$ (depletion region) the following applies for the capacitance:

$$C(V_{JNCT}) = C_0\left[DELTA + \frac{1 - DELTA}{\left(1 - \frac{V_{JNCT}}{V_{DIFF}}\right)^{ALPHA}}\right] \quad \text{(Equation 9)}$$

where DELTA, ALPHA, $V_{DIFF}$ are constant and are 0.1, 0.5, and 0.6 respectively. $C_0$, according to the switching edge, is set to be CR1 for the on switch and CR0 for the off switch. Thereby, the charge balance is preserved to prevent unwanted current injection at the transition from CR1 to CR0, and vice versa.

To damp the oscillations that may occur in the system, additional damping resistance (R(Vds) in FIG. 2) is used in the model. The values of the damping resistances depend on the dynamic parameter DAMPING (listed in the table of FIG. 4), the values of the parasitic inductances L, and the values of the internal capacitances C(V), which are effective capacitances considering the actual applied input and feedback capacitance. The equation for $R_{DAMP}$, which may be equivalent to R(Vds) in FIG. 2 is:

$$R_{DAMP} = DAMPING \cdot \sqrt{\frac{L}{C(V)}} \quad \text{(Equation 10)}$$

Dynamic time parameter TAUS controls the duration of the excess carrier storage at off switch. TAUTAIL and DELTATAIL influence the off switch D-S current edge. DELTATAIL shapes the falling edge, while TAUTAIL sets the duration. TAUFD is a time parameter for diffusion capacitance $C_{diff}$ in FIG. 2. The dynamic parameters CIN0, CIN1, CR1, CR0, RG, TAUS, TAUFD, TAUTAIL, and DELTATAIL all have working point dependency (current I, voltage V, and temperature T) that is realized with a product approach as shown in the following equations:

$$C_x = C_{x0} * x_I(I) * x_V(v) * x_T(T) \quad \text{(Equation 11)}$$

$$x_I(I) = CC0 + (1 - CC0)\left(\frac{I}{I_{NOM}}\right)^{CC} \quad \text{(Equation 12)}$$

$$x_V(V) = VC0 + (1 - VC0)\left(\frac{V}{V_{NOM}}\right)^{VC} \quad \text{(Equation 13)}$$

$$x_T(T) = \left(\frac{T_J}{T_{NOM}}\right)^{TC} \quad \text{(Equation 14)}$$

Figure 5:
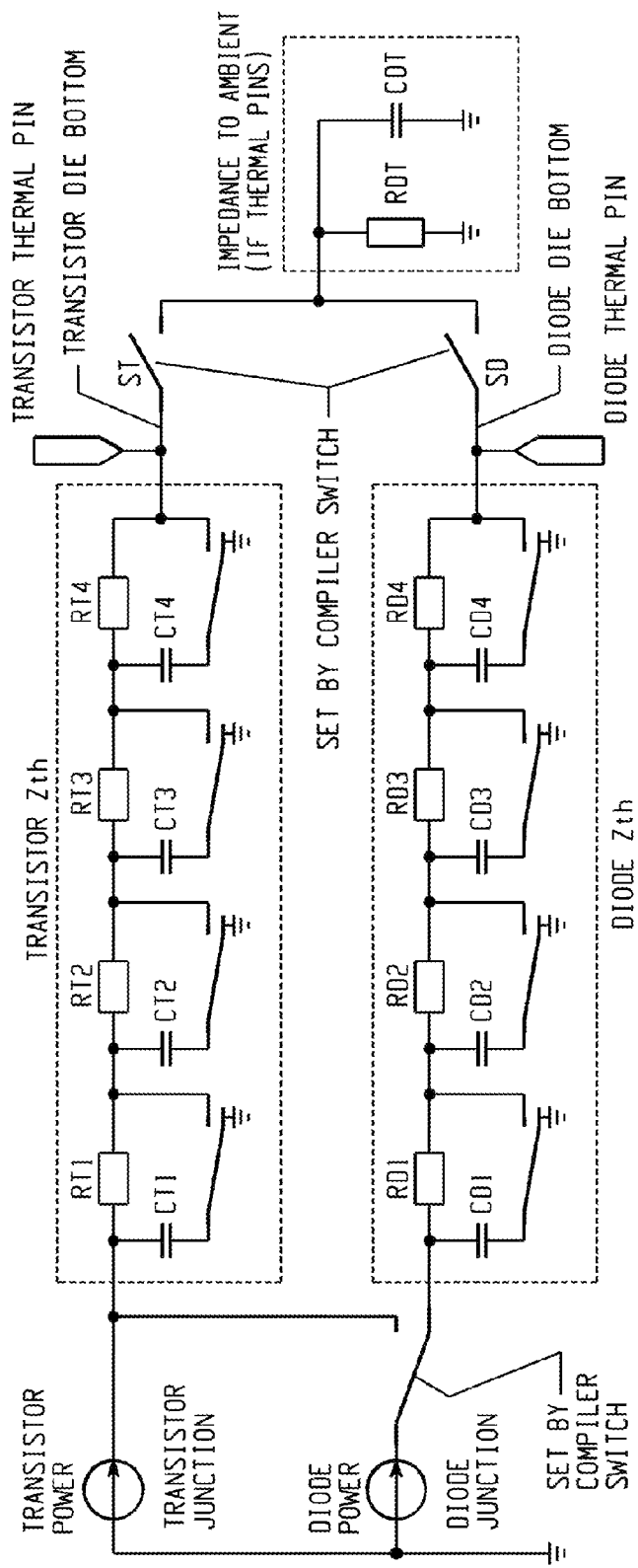
FIG. 5 is an example thermal network used in a power MOSFET model.

To model thermal characteristics of a power MOSFET, the power MOSFET model described herein includes features that implement a thermal model. In an example, the thermal model is a standard 4-order thermal network model from junction to case. A thermal impedance curve generated via the model can be fitted to the curves or data provided in a device datasheet. The thermal model provides a user with an option to choose between the continued fraction (Cauer type) and the partial fraction thermal (Foster type) networks. Using the schematic illustrated in FIG. 5, the electrical power losses of both the transistor and the diode are injected into a common heat sink. The ground symbol refers to the ambient. Four sets of CT, RT and CD, RD parameters are the model fitting parameters. These CT, RT, CD, RD parameters are static parameters of the power MOSFET model, the determination of which is described below. An internal or external heat sink can be used in the model.

In order to determine parameters of the power MOSFET model described above with reference to FIGS. 2-5, a model parameter extraction procedure is performed. The model parameter extraction procedure is used to determine static and dynamic parameters of the model, as described above with reference to FIGS. 1A and 1B. Parameter extraction, also called device characterization, starts with a determination of static parameters of the model, and a determination of dynamic parameters follows. FIG. 6 is a table listing steps used in an example model parameter extraction procedure. In a first step listed in the table, device characteristics fitted include transfer characteristics, and the $V_p$, K, and $N_{FET}$ static parameters of the model (described above) are determined. In a second step listed in the table, device characteristics fitted include output characteristics, and the RD0, RD1, RDV, $M_{FET}$, $A_{FET}$, KLM static parameters and their temperature coefficients are determined. In a third step listed in the table, device characteristics fitted include diode forward characteristics, and the $M_F$, $I_{SATD}$, $R_B$ static parameters and their temperature coefficients are determined. In a fourth step listed in the table, device characteristics fitted include thermal characteristics, and the RT1-4, CT1-4, RD1-4, CD1-4 static parameters of the model are determined. In a fifth step listed in the table, device characteristics fitted include characteristics relating to switching time and energy, and CIN1, CIN1, CR0, CR1, DAMPING, TAUFD, TAU-TAIL, DELTATAIL, TAUS, RG dynamic parameters and their working point coefficients are determined.

In each step described above and illustrated in the table of FIG. 6, device data from a datasheet is fitted, and a group of model parameters are extracted. Steps 1 to 4 are static fitting steps used to determine static parameters of the power MOSFET model. In the static fitting steps, sampled data from critical curves included in the datasheet for the device are used, and variables of Equations 1-7 (e.g., the static functions characterizing the MOSFET model) are fit to the sampled data in order to cause the power MOSFET model to have same static characteristics as the device. In other words, static parameters of the power MOSFET model are determined by fitting variables of Equations 1-7 to data of the datasheet, and the determined static parameters cause the power MOSFET model to have characteristics in a steady-state mode of operation that correspond to those of the device.

Specifically, steps 1 to 4 illustrated in the table of FIG. 6 each comprise a curve fitting procedure based on Newton's method. In each of steps 1 to 4, sample points from the datasheet curves of the specified characteristics are utilized, and variables of Equations 1-7 (corresponding to the static parameters of the model) are fit to the sampled points in the predefined sequence of parameter subsets listed in FIG. 6 to guarantee convergence. A Jacobian matrix is calculated numerically by double-sided differentiation of the static model equations.

Step 5 of the table of FIG. 6 is a dynamic behavior matching step, which uses computer simulations (e.g., comprising a "simulation in the loop method," described below) to determine dynamic parameters of the power MOSFET model. The dynamic parameters are determined in a manner that causes an error between transient response characteristics of the model (e.g., $E_{ON}$, $E_{OFF}$, $T_{ON}$, and $T_{OFF}$ values of the model, described in detail below) and transient response characteristics of the device (e.g., $E_{ON}$, $E_{OFF}$, $T_{ON}$, and $T_{OFF}$ values of the device, as listed on the datasheet) to be minimized. FIGS. 7-16, described below, illustrate aspects of a dynamic parameter extraction procedure.

The MOSFET's dynamic model comprises a highly nonlinear, multiple input to multiple output (MIMO) system. As such, the dynamic parameters of the power MOSFET model cannot be determined using conventional fitting methods. The systems and methods described herein utilize computer simulations to obtain an optimal set of dynamic parameters. The approach utilizes a numerical algorithm based on Newton's method (also referred to as the Newton-Raphson method). Rather than using analytical expressions, the approach described herein uses computer simulations, including transient analysis simulations and sensitivity analysis simulations, to calculate error and determine how the dynamic parameters should be adjusted between iterations of the procedure. The dynamic parameters are optimized to minimize an error between $E_{ON}$, $E_{OFF}$, $T_{ON}$, and $T_{OFF}$ values of the model, as determined via simulations, and $E_{ON}$, $E_{OFF}$, $T_{ON}$, and $T_{OFF}$ values of the device to be modeled, as determined from the datasheet. These values are described below.

It is noted that under the approaches described herein, computer simulations are used to obtain an optimal set of dynamic parameters. The techniques described herein are rooted in computer technology and are vastly different than merely using a computer to solve analytical expressions. As noted above, computer simulations (e.g., transient analysis simulations and sensitivity analysis simulations) are used, for instance, to calculate error and determine how the dynamic parameters should be adjusted between iterations of the procedure. Accordingly, it is evident that the approaches described herein are vastly different from merely using a computer to solve conventional analytical expressions.

It is further noted that the techniques described herein apply not only to MOSFET devices, but rather can also be used to extract models for other power electronic devices, including but not limited to thyristors, JFETs, BJTs, IGBTs, diodes, etc. For these devices, it is generally not possible to derive their dynamic characteristics as functions of model parameters. But using the procedures described herein, fitting error and searching direction can be acquired through simulation instead of functions (e.g., instead of analytical expressions), which enables automatic model parameter extraction for such devices.

In the determination of the dynamic parameters, P is defined to be the vector of dynamic parameters of the MOSFET model, and G is defined to be the vector of dynamic characteristics to be fit (i.e., the goal values). The dynamic characteristics include switching times $T_{ON}$, $T_{OFF}$ and energies $E_{ON}$, $E_{OFF}$, or a subset of them, depending on data availability. The $T_{ON}$ value represents a time elapsed in switching the device from an off state to an on state, the $T_{OFF}$ value representing a time elapsed in switching the device from the on state to the off state, the $E_{ON}$ value represents an energy loss in switching the device from the off state to the on state, and the $E_{OFF}$ value represents an energy loss in switching the device from an on state to an off state. $G_{DATA}(wp)$ is a vector defined to be the datasheet values of G, which are measurements dependent on working point wp=[current, voltage, temperature]. Usually, multiple $G_{DATA}$ vectors are available in the datasheet for different working point values. $G_{SIM}(P, wp)$ is a vector including the values of G determined via simulation. The value $G_{SIM}(P, wp)$ depends on the dynamic parameters P and the working point coefficients wp. The goal of the optimization problem is to minimize the following equation:

$$Z = G_{SIM}(P, wp) - G_{DATA}(wp), \quad \text{(Equation 15)}$$

where Z is the vector of error between the values of G determined via simulation and the values of G determined from the datasheet.

Figure 7:
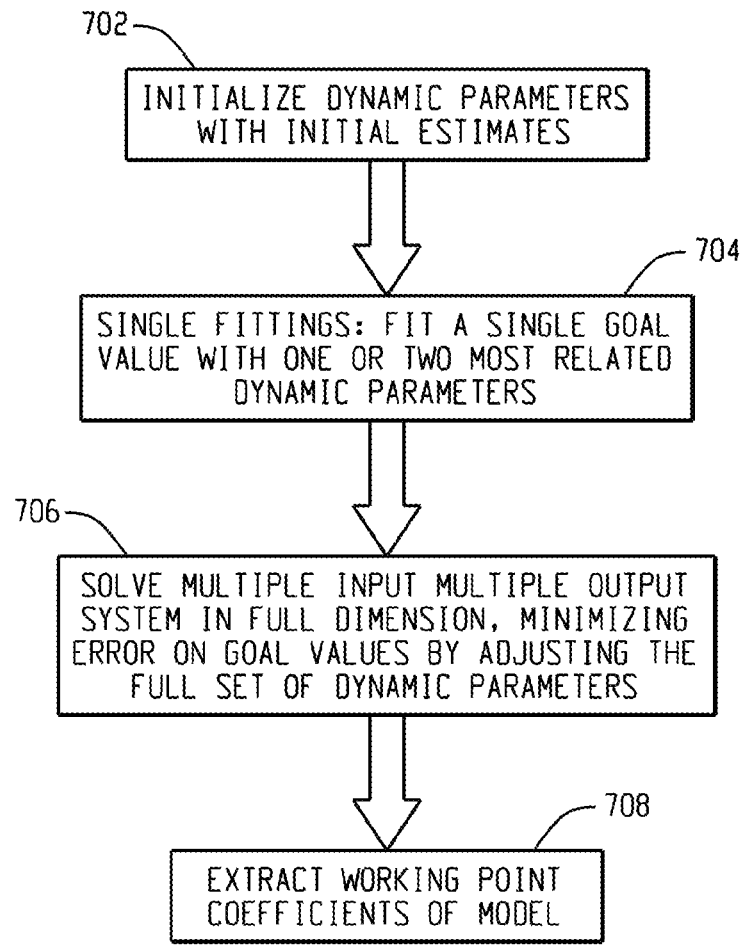
FIG. 7 is a flow diagram depicting example steps used in determining dynamic parameters of a power MOSFET model.

FIG. 7 is a flow diagram depicting example steps used in determining dynamic parameters of a power MOSFET model. At 702, the dynamic parameters of the model are initialized with initial estimates. The determination of the initial estimates is described below. At 704, "single fittings" are performed. In each single fitting, a single goal value is fit using one or two dynamic parameters (e.g., one or two dynamic parameters that are determined to be most related to the single goal value being fit). In this step, the complex multi-dimensional optimization problem is decomposed to several small-scale problems in 1D spaces. The use of the single fittings step, described in detail below, may enable faster convergence.

At 706, the multiple input to multiple output system is solved in full dimension, minimizing an error on goal values by adjusting the full set of dynamic parameters. Step 706, described in further detail below, may also be known as a "mutual dependencies fitting" step. At 708, working point coefficients of the model may be determined. Upon reaching step 708 in the dynamic parameter extraction procedure, the power MOSFET model should exhibit the desired dynamic behavior for the nominal working point of $W_{NOM}$, and step 708 is used to extract working point coefficients. Steps 704 and 706 of the method may be repeated for multiple working points (e.g., working points specified by a user). Step 708 is an optional step, and if datasheet data for other working points is not available, the default working point coefficient may represent the general effect of working point dependency in the model. These aspects and others of step 708 are described in further detail below.

As described above, a first step in the determination of the dynamic parameters of the model is an initialization procedure in which the dynamic parameters are initialized with initial estimates. In performing this initialization step, all internal capacitances of the model should be activated. FIG. 8 is a table including information on the setting of initial estimates for dynamic parameters of the model.

As described above, a second step in the determination of the dynamic parameters of the model is a single fittings procedure. Broadly, this step involves (i) executing multiple computer simulations in which a value of a dynamic parameter in the model is varied over the multiple simulations while holding constant values of other dynamic parameters in the model, where each of the multiple computer simulations generates a set of goal values indicative of the model's transient-response characteristics; (ii) for each of the multiple simulations, determining an error value indicating a difference between a single value of the set of goal values (e.g., a single one of the $E_{ON}$, $E_{OFF}$, $T_{ON}$, $T_{OFF}$ values of the model) and a single, corresponding datum from the datasheet; and (iii) determining a value of the dynamic parameter that minimizes the error value. For example, in the single fittings step, a set of computer simulations may be executed, where a value of the dynamic parameter CIN0 is varied over the set of simulations, while leaving the values of other dynamic parameters constant. Each simulation of the set of simulations is used to determine a set of goal values ($E_{ON}$ $E_{OFF}$ $T_{ON}$, $T_{OFF}$). For each simulation of the set of simulations, an error value is determined, where the error value represents a difference between $E_{ON}$ (simulation) and $E_{ON}$ (datasheet). A value of the CIN0 dynamic parameter that minimizes this error value is determined. This is an example single fitting, where the dynamic parameter changed is the CIN0 parameter, and the fitting goal is the $E_{ON}$ goal value.

Figures 9, 10:
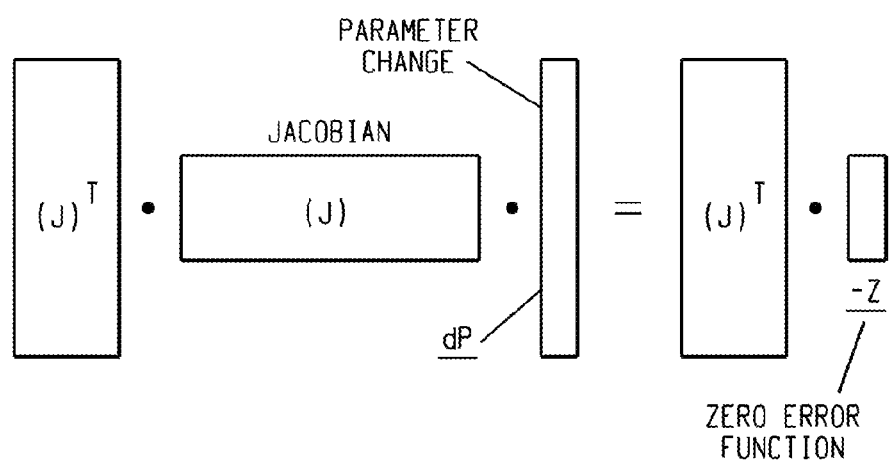
FIG. 9 is a table including information on a single parameter fitting step of an example model parameter extraction procedure.
FIG. 10 is a block diagram illustrating aspects of a mutual-dependencies fitting step of an example model parameter extraction procedure.

More specifically, in the single fittings procedure, the initial parameter estimates determined in the initialization step are improved using single parameter fitting for the goal values. The parameter adjustment direction is based on results of local sensitivity analyses or knowledge of the MOSFET model. This step is performed in order to decompose the complex multi-dimensional optimization problem into several small problems, so that the optimal dynamic parameters are determined with a smaller computational burden. FIG. 9 shows example goal values and corresponding dynamic parameters that may be used in the single fittings procedure.

As described above, a third step in the determination of the dynamic parameters of the model is the solving of the multiple input to multiple output system in full dimension, minimizing an error on goal values by adjusting the full set of dynamic parameters. In this step, the mutual dependencies of parameter changes to goal values are taken into account. Thus, in the mutual dependencies fitting step, the general optimization problem is solved to minimize the error vector Z, defined above.

In order to minimize Z, a modified version of Newton's method that is based on computer simulations is utilized. As described below, a number of iterations are performed, and in each iteration, values of the dynamic parameters are adjusted. The error vector Z may be determined after each iteration. FIG. 10 shows an equation including a vector dP, the vector dP defining an amount by which each of the dynamic parameters of the vector P are adjusted between iterations of the procedure. In this figure, the matrix J is the Jacobian matrix defined by:

$$(J) = \begin{pmatrix} \frac{\partial E_{ON}}{\partial C_{IN0}} & \frac{\partial E_{ON}}{\partial C_{IN1}} & \frac{\partial E_{ON}}{\partial C_{R0}} & \frac{\partial E_{ON}}{\partial C_{R1}} & \frac{\partial E_{ON}}{\partial \tau_{FD}} & \frac{\partial E_{ON}}{\partial \tau_{TAIL}} \\ \frac{\partial E_{OFF}}{\partial C_{IN0}} & \frac{\partial E_{OFF}}{\partial C_{IN1}} & \frac{\partial E_{OFF}}{\partial C_{R0}} & \frac{\partial E_{OFF}}{\partial C_{R1}} & \frac{\partial E_{OFF}}{\partial \tau_{FD}} & \frac{\partial E_{OFF}}{\partial \tau_{TAIL}} \\ \frac{\partial T_{on}}{\partial C_{IN0}} & \frac{\partial T_{on}}{\partial C_{IN1}} & \frac{\partial T_{on}}{\partial C_{R0}} & \frac{\partial T_{on}}{\partial C_{R1}} & \frac{\partial T_{on}}{\partial \tau_{FD}} & \frac{\partial T_{on}}{\partial \tau_{TAIL}} \\ \frac{\partial T_{off}}{\partial C_{IN0}} & \frac{\partial T_{off}}{\partial C_{IN1}} & \frac{\partial T_{off}}{\partial C_{R0}} & \frac{\partial T_{off}}{\partial C_{R1}} & \frac{\partial T_{off}}{\partial \tau_{FD}} & \frac{\partial T_{off}}{\partial \tau_{TAIL}} \end{pmatrix}$$ (Equation 16)

As illustrated in FIG. 10, the iterative parameter adjustment follows Newton's standard method, where the vector dP is determined by solving:

$$J^T J dp = -J^T Z$$ (Equation 17)

The dynamic parameters are updated for a next iteration according to:

$$P_{k+1} = P_k dP$$ (Equation 18)

Figure 11:
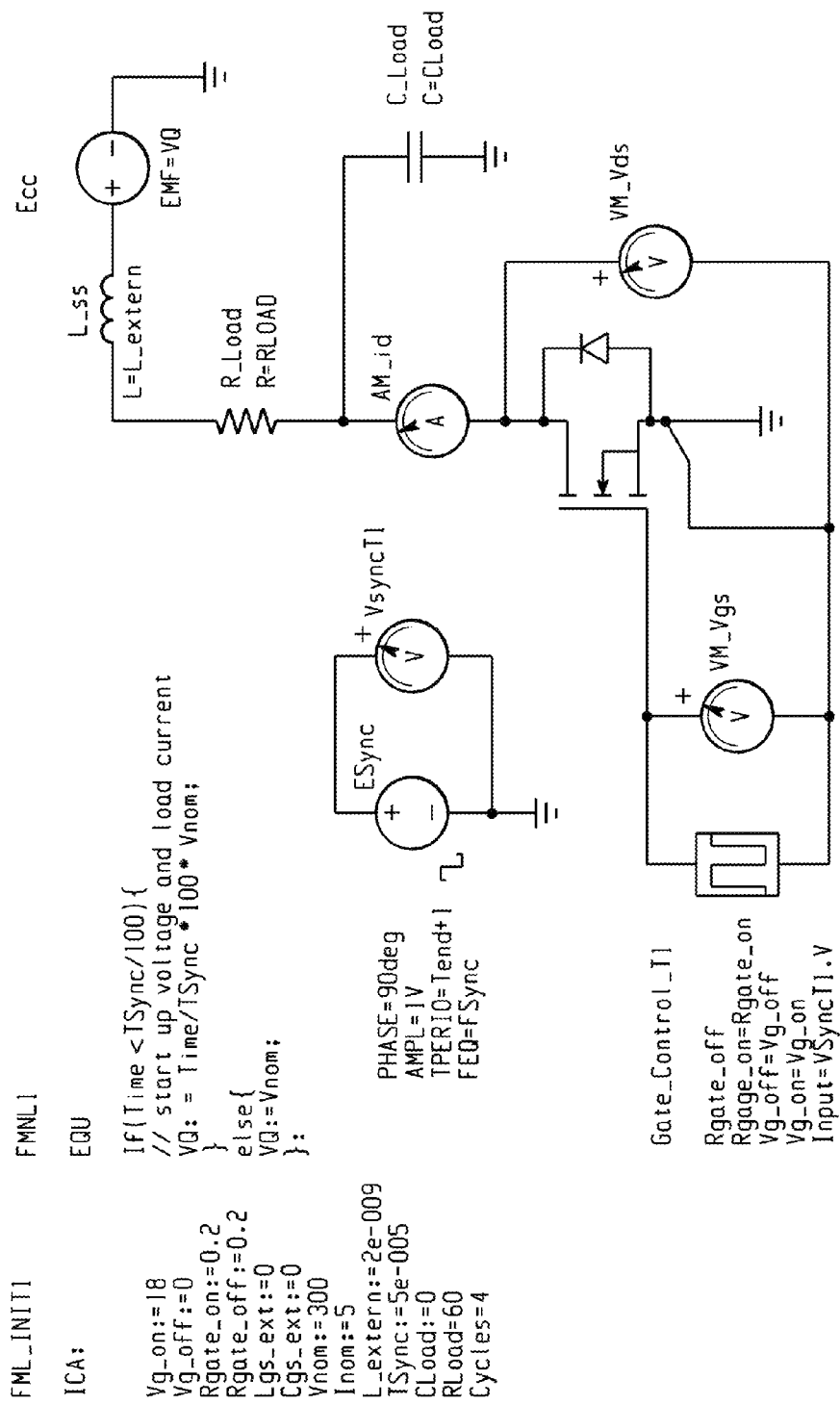
FIGS. 11 and 12 depict test circuits that may be utilized in computer simulations, where the computer simulations are used in determining dynamic parameters of a power MOSFET model.
Figure 12:
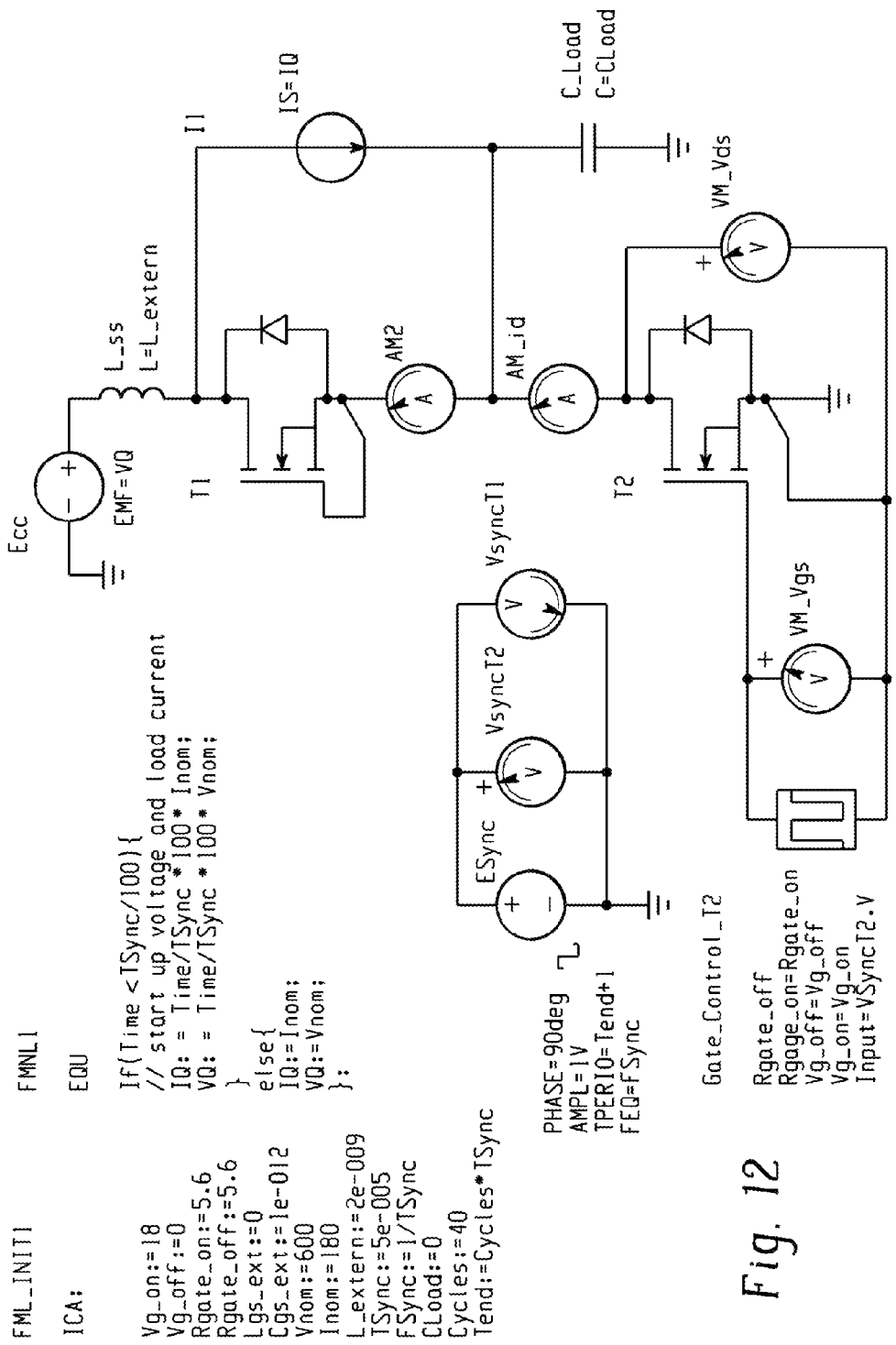

In solving Equation 17, the Jacobian matrix J and error vector Z are determined via computer simulations. Because there is no analytical expression of dynamic characteristics G as a function of P, one cannot calculate Z or derive J directly. Thus, to overcome this obstacle, computer simulations are utilized in the approaches described herein. Specifically, the power MOSFET model, as configured with a set of static parameters (e.g., static parameters previously determined) and a current set of dynamic parameters (e.g., dynamic parameters determined as a result of the steps 702, 704 or dynamic parameters utilized in a previous iteration of the mutual dependencies fitting), undergoes simulation using a test circuit. The test circuit is configured to provide control signals for switching a state of the power MOSFET model. Using the test circuit, the model's dynamic switching waveforms are simulated, thus enabling the vector $G_{SIM}(P, wp)$ to be determined. The test circuits used are standard test circuits that are the same as those used by manufacturers when measuring the characteristics $G_{DATA}$ included in the datasheet. Thus the $G_{SIM}$ measurement determined from the simulation is obtained under the same operating conditions as are used in characterizing the real-world device. FIGS. 11 and 12 show example test circuits that may be used in performing a simulation of the power MOSFET model. For a single MOSFET device, the test circuit of FIG. 11 may be used for dynamic characteristics measurement. For a MOSFET module with multiple MOSFETs in one package, the half-bridge test circuit of FIG. 12 may be used.

As noted above, to determine the amount by which the dynamic parameters P should be adjusted between iterations of the mutual dependencies fitting, the Jacobian matrix J and the error vector Z are determined. To determine the error vector Z, based on the definition of Z in Equation 15, $G_{DATA}$ is determined directly from data provided in the datasheet, while $G_{SIM}$ is determined from simulation waveforms. The simulation waveforms are an output of transient analysis simulations performed using the model and a test circuit (as described above). The simulation waveforms are processed (e.g., switching waveforms are segmented, sampled, and interpolated, as described below) to determine the $G_{SIM}$ vector.

Elements of the Jacobian matrix J are determined using a sensitivity analysis. In the sensitivity analysis, for each of the dynamic parameters of the model, a set of computer simulations are executed in which a value of the dynamic parameter in the model is varied over the set of simulations while holding constant values of other dynamic parameters in the model. The values of the matrix J comprise sensitivity coefficients, each sensitivity coefficient indicating an effect that varying a dynamic parameter has on a transient-response characteristic of the model. In the executing of the set of computer simulations in which the value of the dynamic parameter is varied over the set of simulations, values for a single column of the matrix J are determined.

Figures 13, 14:
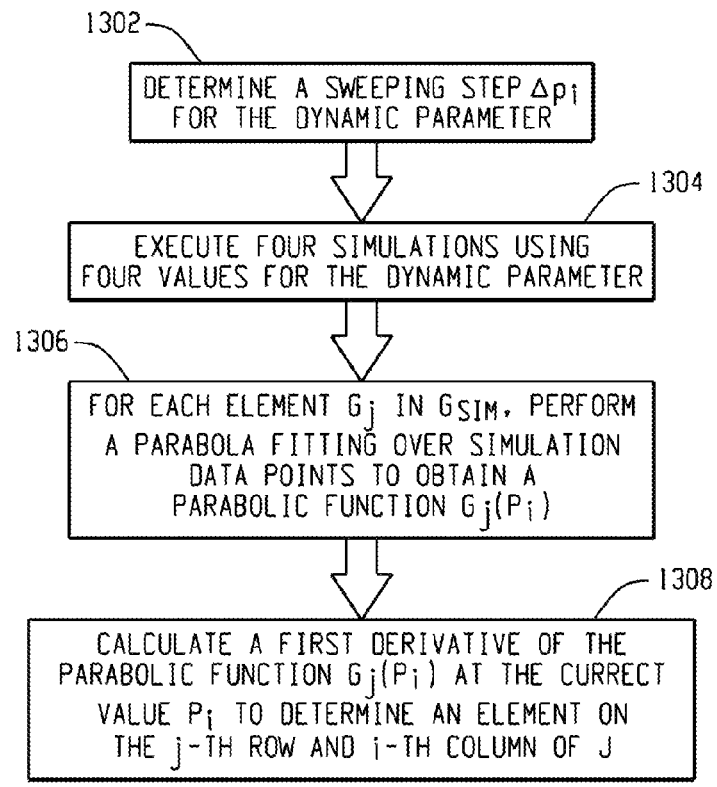
FIG. 13 is a flow diagram depicting example steps of a sensitivity analysis used in determining parameters of a power MOSFET model.
FIG. 14 is a table depicting optional working points that may be selected by a user.

Specifically, in the sensitivity analysis, one parameter is swept at a time to study its influence on the dynamic fitting goals, and each sensitivity analysis, or parameter sweep, can generate one column in J. FIG. 13 is a flow diagram depicting example steps of a sensitivity analysis used in determining parameters of a power MOSFET model. At 1302, a sweeping step $\Delta P_i$ for the specified parameter $P_i$ is determined based on a current value of $P_i$ and boundary. At 1304, four simulations are executed over four parameter values: $P_{i,min}$, $P_{i,min}+\Delta P_i$, $P_{i,min}+2\Delta P_i$, and $P_{i,max}$, where analysis range $P_{i,min}$, $P_{i,max}$ is adaptively determined based on $P_i$, and $\Delta P_i=(P_{i,max}-P_{i,min})/3$. $G_{SIM}$ is determined for each simulation (e.g., using a measurement tool). At 1306, for each element $G_j$ in $G_{SIM}$, a parabola fitting is performed over the simulation data points to obtain a parabolic function $G_j(P_i)$. At 1308, a first derivative of $G_j(P_i)$ is determined at a current value of $P_i$ to determine the element on the jth row and ith column of J. The purpose of the parabola fitting over the parameter sweep is to reduce noise, as compared to direct double-sided differentiation over simulations using parameters $P_i-\Delta P_i$ and $P_i+\Delta P_i$, with very small $\Delta P_i$.

Ideally, J and Z should be updated with the new parameters at every iteration in Newton's Method. However, obtaining J is computationally expensive, and thus, in an example, only Z is updated in each iteration, and J is updated every m iterations. J can be updated up to n times during the numerical search, so the maximum number of iterations is mn. Values of m and n may be changed (e.g., by a user), and in an example, default values of m and n are m=15 and n=5. The numerical search of optimal parameters is concluded when one of the following conditions is satisfied: (i) a fitting error smaller than a tolerance (e.g., threshold value) is attained; (ii) the fitting error changes only a small amount (e.g., less than a threshold percentage); (iii) a maximum number of iterations are exceeded; or (iv) divergence is detected.

As described above, an optional fourth step in the determination of the dynamic parameters is the determination of working point coefficients of the model. After performing the mutual dependencies fitting described above, the model exhibits the desired dynamic behavior for a nominal working point. When the MOSFET is operated under a different condition, its current and voltage waveforms generally depend on the load current I in the DC conduction state, the blocking voltage V for the non-conducting part of the switching period, the gate drive conditions reflected into the gate voltage slope S at the threshold voltage, and the temperature T of the active semiconductor region. This working point dependency is modeled by the working point coefficients. The power MOSFET model described herein utilizes a default set of coefficients, thus causing the model to have the general working point dependency behavior. After characterization for nominal working point conditions, this general behavior may be determined in a more precise manner. Specifically, for users who have data of different working points and want better agreement to such measurement or datasheet values, the systems and methods described herein provide the option of extra working points fitting, so that the working point coefficients can be optimized.

FIG. 14 is a table depicting the optional working points (each represented in a row) that may be selected. "nom" is the nominal working point, which is necessary and already fitted in previous steps of the method described herein. The rest of the working points in the table are optional working points. Thus, if a user has data of dynamic fitting goals under an optional working point, the user can enable this working point, input the bias value from the nominal working point, and input the fitting goals. Steps 704, 706 of the dynamic parameter extraction (described above) are performed for each enabled working point.

Figure 15:
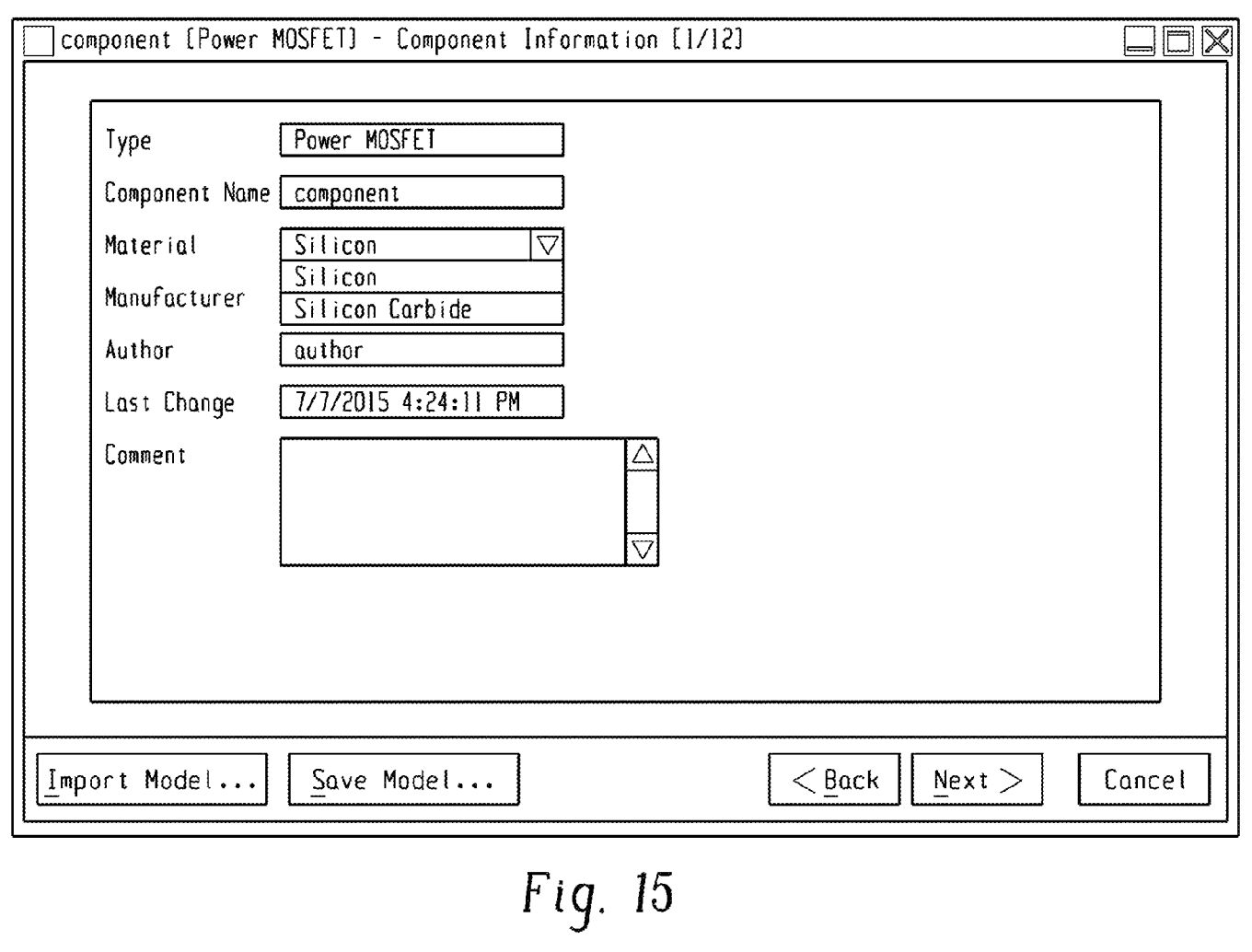

The model and parameter extraction procedure described herein are technology independent, meaning that they are not specific to a certain semiconductor material, structure, or manufacturing technology and thus can be used to characterize all types of MOSFETs. Compared to Si technology, SiC MOSFETs have higher switching speed and smaller switching loss. In terms of characteristics measurements $E_{ON}$, $E_{OFF}$, $T_{ON}$ and $T_{OFF}$, these features can be directly captured in the dynamic extraction procedure described above. However, in addition to the fitting goals, SiC MOSFETs also exhibit significant differences in transient waveforms. Since commercially available SiC devices have no minority carrier effects, such devices have zero reverse recovery and almost no tail current. The approaches described herein include features designed to account for the differences in transient waveforms. Specifically, these differences can be accounted for using a special configuration during extraction of dynamic parameters: based on a determination that the semiconductor device is a SiC power MOSFET device, limits are placed on the $\tau_{FD}$, $\tau_{TAIL}$, $\tau_S$, and $\delta_T$ dynamic parameters of the model (i.e., these parameters are not permitted to exceed certain maximum values). Thus, the dynamic parameters $\tau_{FD}$, $\tau_S$, $\tau_T$, and $\delta_T$, which are related to reverse recovery and tail current, are limited to small values based on the determination that the MOSFET is a SiC power MOSFET. The special configuration for SiC MOSFETs may be employed based on a user selection, where the user selection indicates that the MOSFET is a SiC MOSFET. FIG. 15 depicts a user interface (UI) that enables a user to specify a material for a power MOSFET model. Using the UI, the user may select that the material for the power MOSFET model is SiC, and the special configuration described above can be employed.

Figure 16:
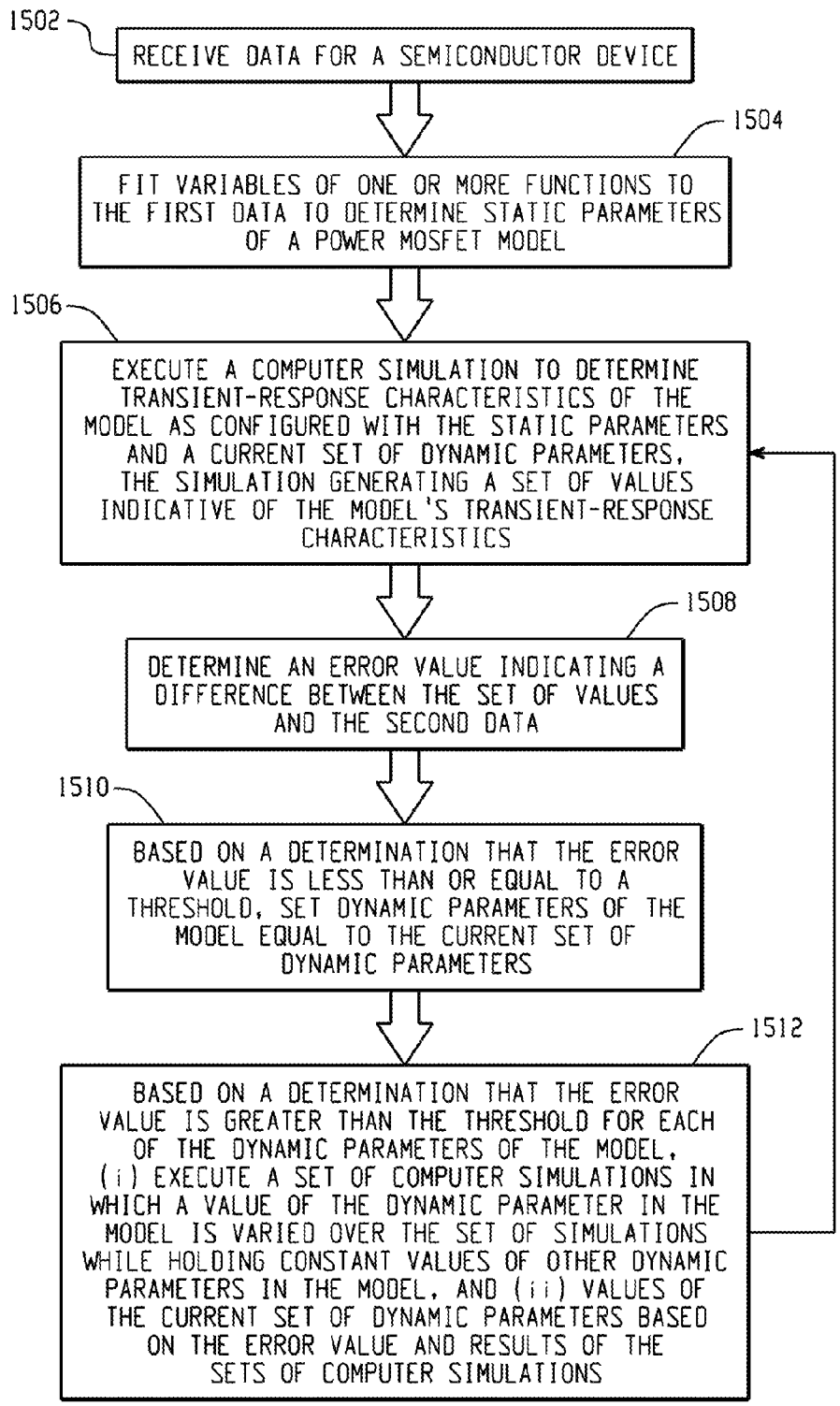
FIG. 16 is a flow diagram depicting example steps of a computer-implemented method for determining parameters of a power MOSFET model.

FIG. 16 is a flow diagram depicting example steps of a computer-implemented method for determining parameters of a power MOSFET model. At 1502, data for a semiconductor device is received. The data includes (i) first data related to characteristics of the device in a steady-state operation, and (ii) second data related to transient-response characteristics of the device. At 1504, variables of one or more functions are fit to the first data to determine static parameters of a power MOSFET model. At 1506, a computer simulation is executed to determine transient-response characteristics of the model as configured with the static parameters and a current set of dynamic parameters, where the simulation generates a set of values indicative of the model's transient-response characteristics. At 1508, an error value indicating a difference between the set of values and the second data is determined. At 1510, based on a determination that the error value is less than or equal to a threshold, dynamic parameters of the model are set equal to the current set of dynamic parameters.

At 1512, based on a determination that the error value is greater than the threshold, for each of the dynamic parameters of the model, a set of computer simulations is executed in which a value of the dynamic parameter in the model is varied over the set of simulations while holding constant values of other dynamic parameters in the model. Continuing at 1512, based on the determination that the error value is greater than the threshold, values of the current set of dynamic parameters are adjusted based on the error value and results of the sets of computer simulations. After adjusting the current set of dynamic parameters, the method may proceed back to steps 1506 and 1508. At these steps, (i) a second set of values indicative of the model's transient-response characteristics, as configured with the adjusted current set of dynamic parameters, is determined, and (ii) a second error value indicating a difference between the second set of values and the second data is determined. At steps 1510, 1512, the dynamic parameters of the model are set equal to the adjusted current set of dynamic parameters or adjusted further based on the second error value. It is noted that the method may iterate through steps 1506-1512 multiple times and until an error value less than the threshold value is determined. In some embodiments, the method may conclude based on any one of (i) the error value being less than a threshold value; (ii) the fitting error changing less than a threshold percentage; (iii) a maximum number of iterations being exceeded; and (iv) divergence being detected. It is noted that steps of the method described herein need not be performed in the order illustrated in FIG. 16.

Figure 17A:
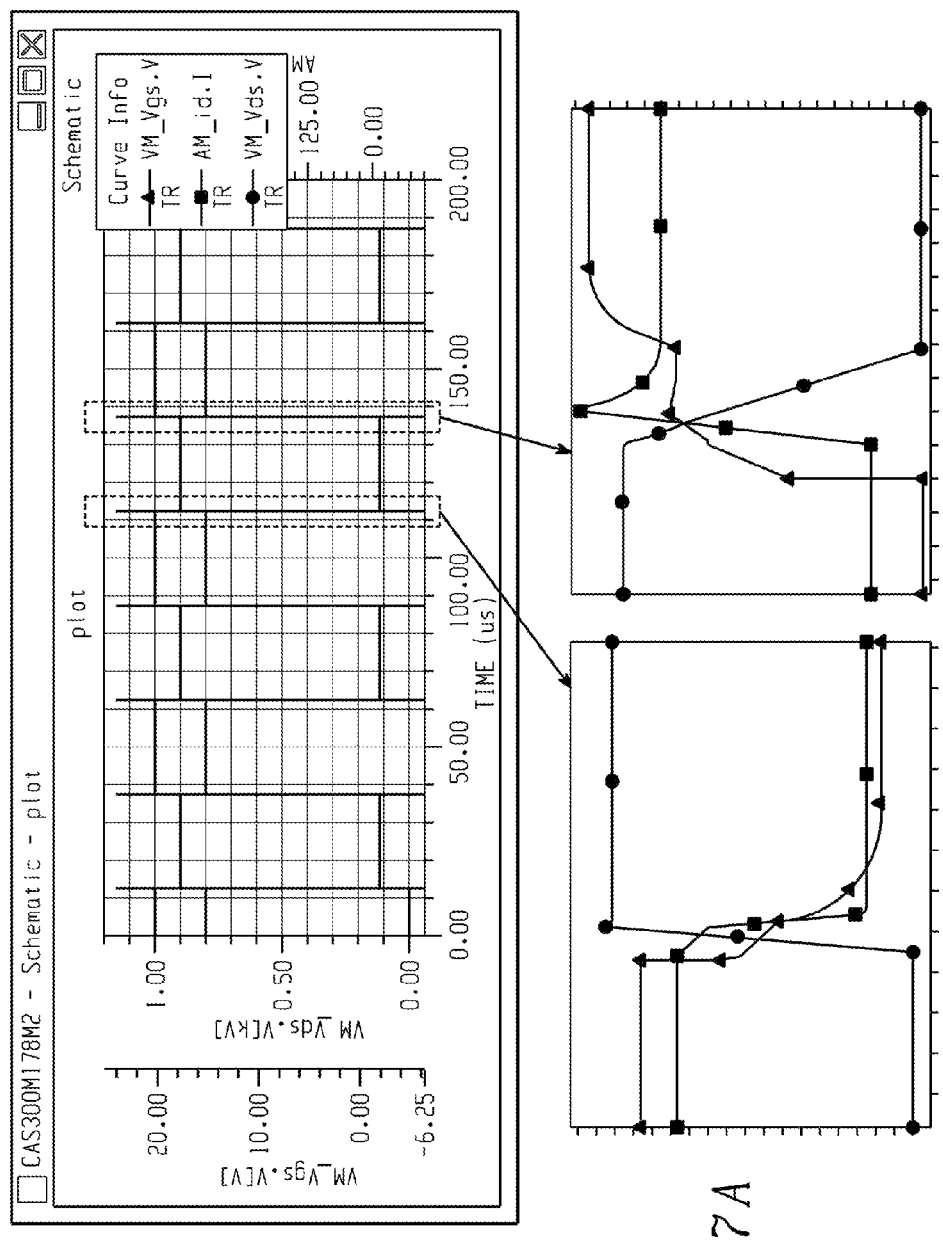
FIG. 17A depicts a segmentation of switching waveforms, as performed using a measurement tool described herein.

FIG. 17A depicts aspects of a measurement tool utilized in the systems and methods described herein. To compare transient simulation results to datasheet characteristics (e.g., $E_{ON}$, $E_{OFF}$, $T_{ON}$, $T_{OFF}$ values from datasheets), the measurement tool is used. The measurement tool is used in post-processing simulation waveforms generated via the simulations. Specifically, the measurement tool may be used in performing (i) a segmentation step, (ii) a smoothing step, and (iii) an interpolation and measurement step, as described below.

Figure 17B:
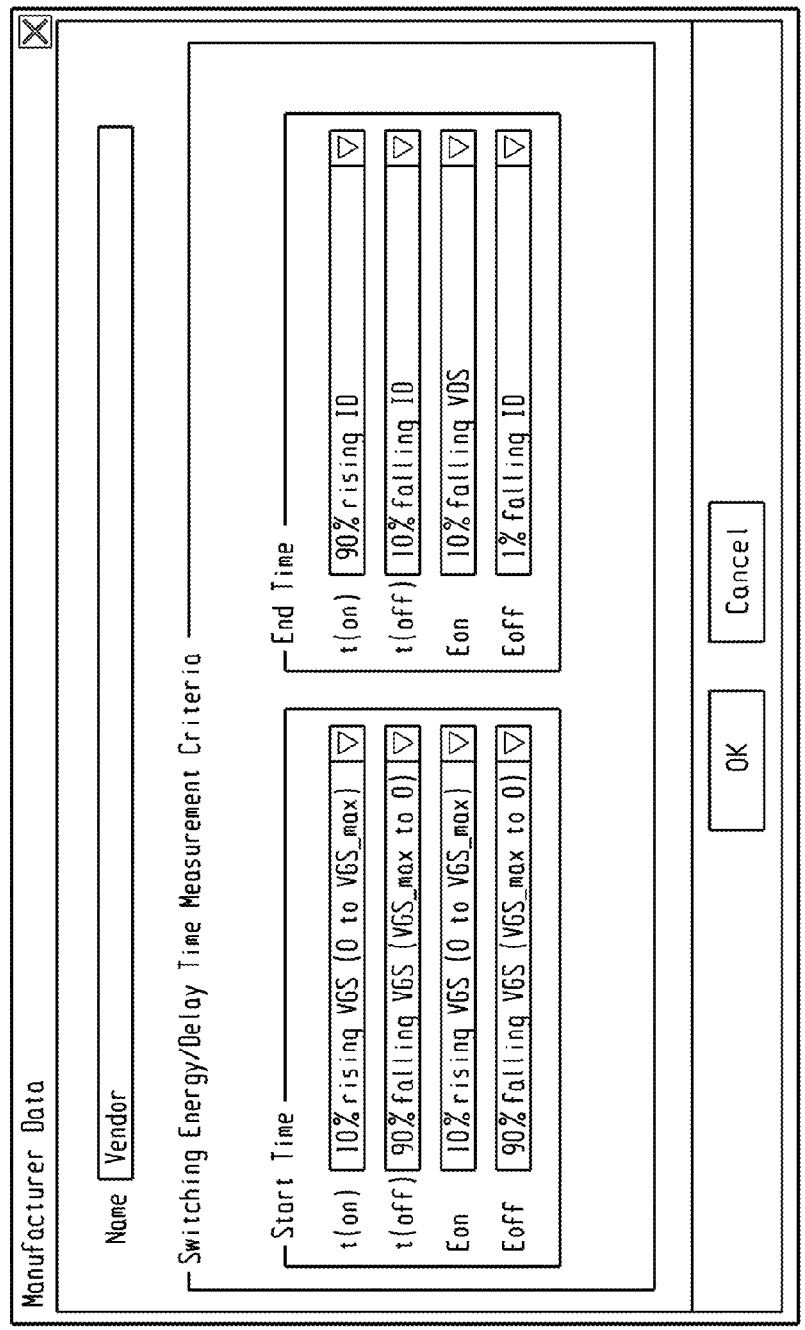
FIG. 17B depicts an example user interface for setting start and end criteria for switching time and energy measurements.

In the segmentation step, the dynamic waveforms of switching the MOSFET model "on" and "off" are segmented from the simulation results. The measurement tool waits for a few switching cycles so that any initial transients die out and segments a piece around the switching on/off time step. The length of segmentation is adaptively adjusted so the whole switching transient is captured. FIG. 17A depicts a segmentation of switching waveforms. In the smoothing step, to address possible numerical noise presented in the simulation, the segmented curves are smoothed via a filter (e.g., a median filter). In the interpolation and measurement step, dynamic characteristics including $E_{ON}$, $E_{OFF}$, $T_{ON}$, and $T_{OFF}$ for the MOSFET model are determined (i.e., measured). One issue in determining these values is that the definition of start and end time for these characteristics can be different from one MOSFET vendor to another. Such definitions are usually provided in datasheets or application notes from the vendor. Measurements of the same waveforms can be quite different depending on which start and end criteria are used. As a result, the $E_{ON}$, $E_{OFF}$, $T_{ON}$, and $T_{OFF}$ characteristics should be measured in the same manner as is used for measuring the datasheet values, in order to fit the model accurately. To solve this issue and adapt the approaches described herein to all MOSFET vendors, the start and end criteria are configurable. In an example, the start and end criteria are configurable via a user interface. FIG. 17B depicts an example user interface for setting start and end criteria for switching time and energy measurements.

Figure 17C:
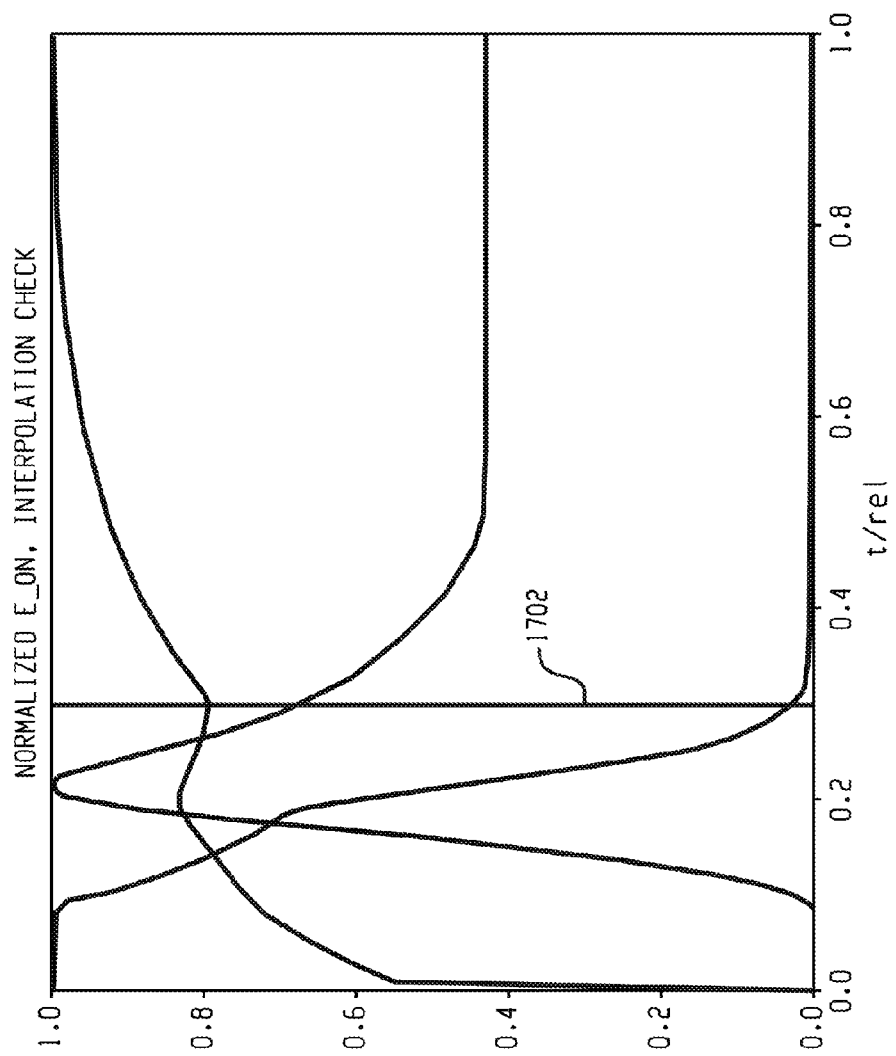
FIG. 17C shows an example of simulation results of "on" switch waveforms following post-processing.
Figure 17D2:
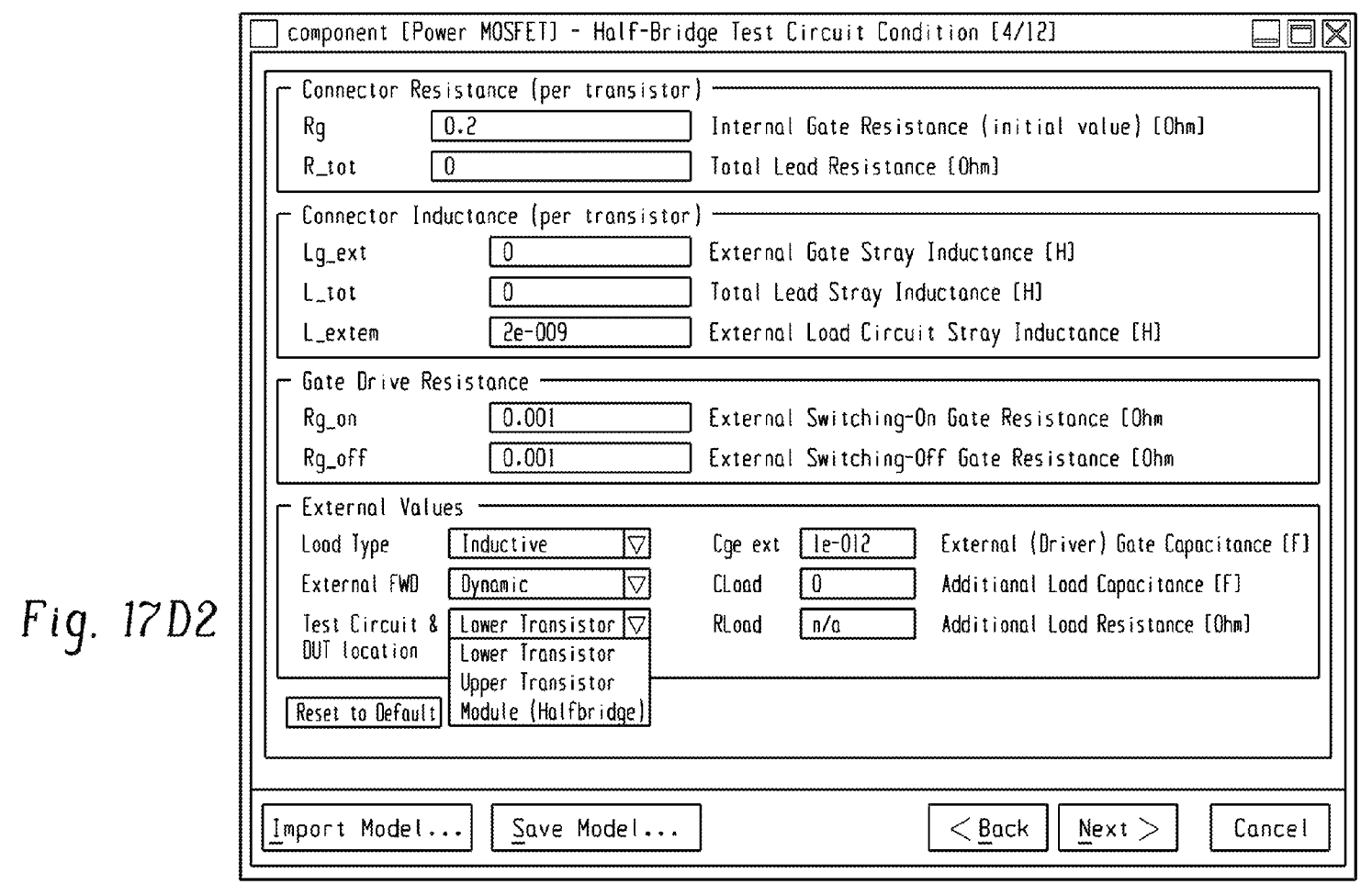
Figure 17E1:
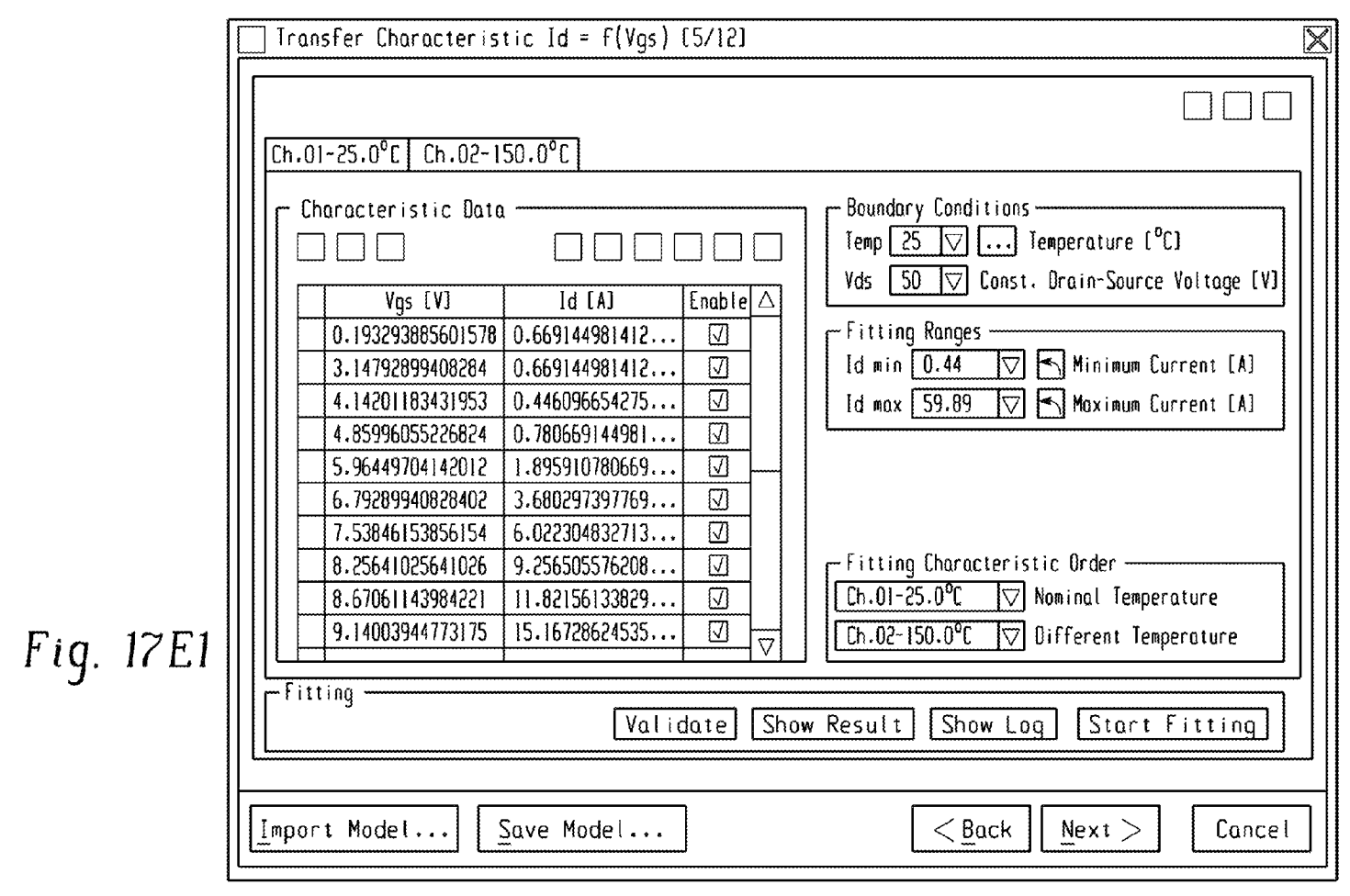
Figure 17G:
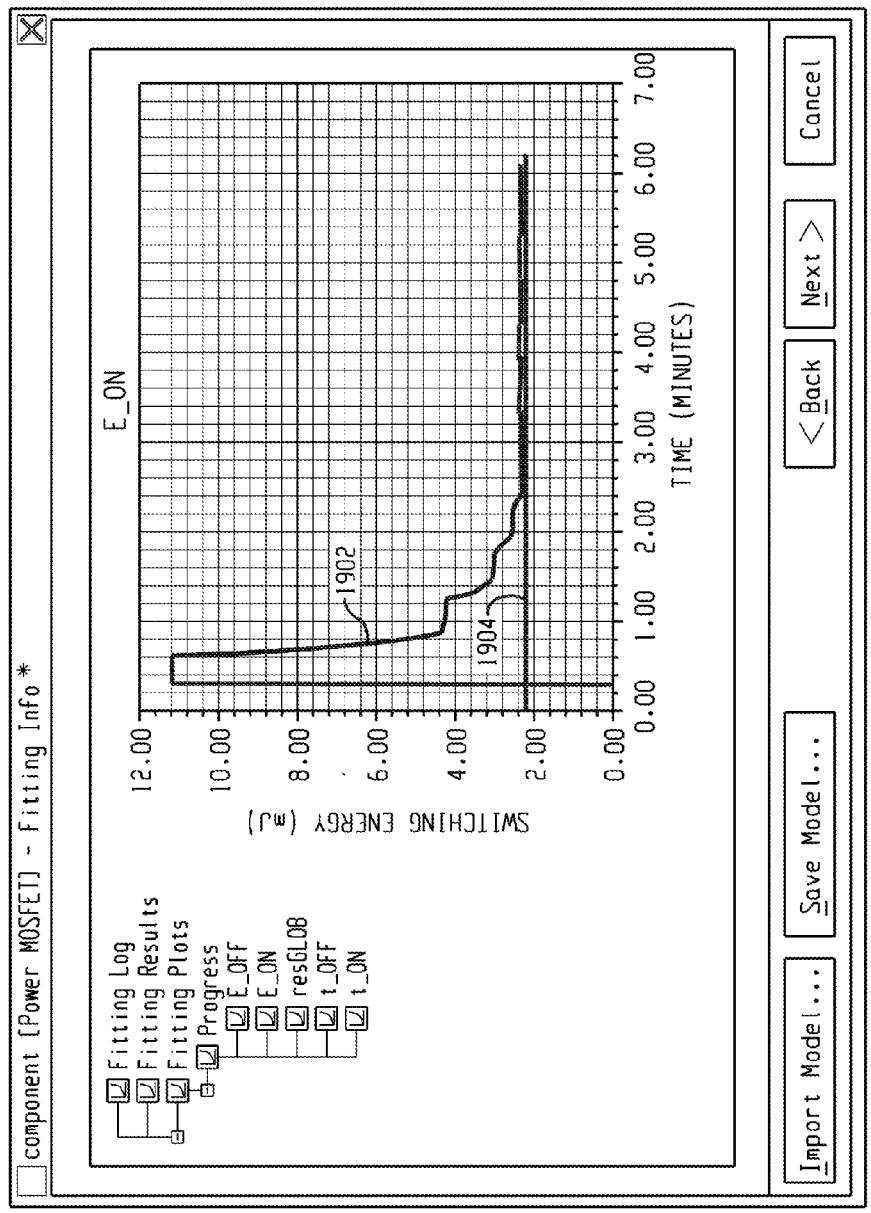
Figure 17H:
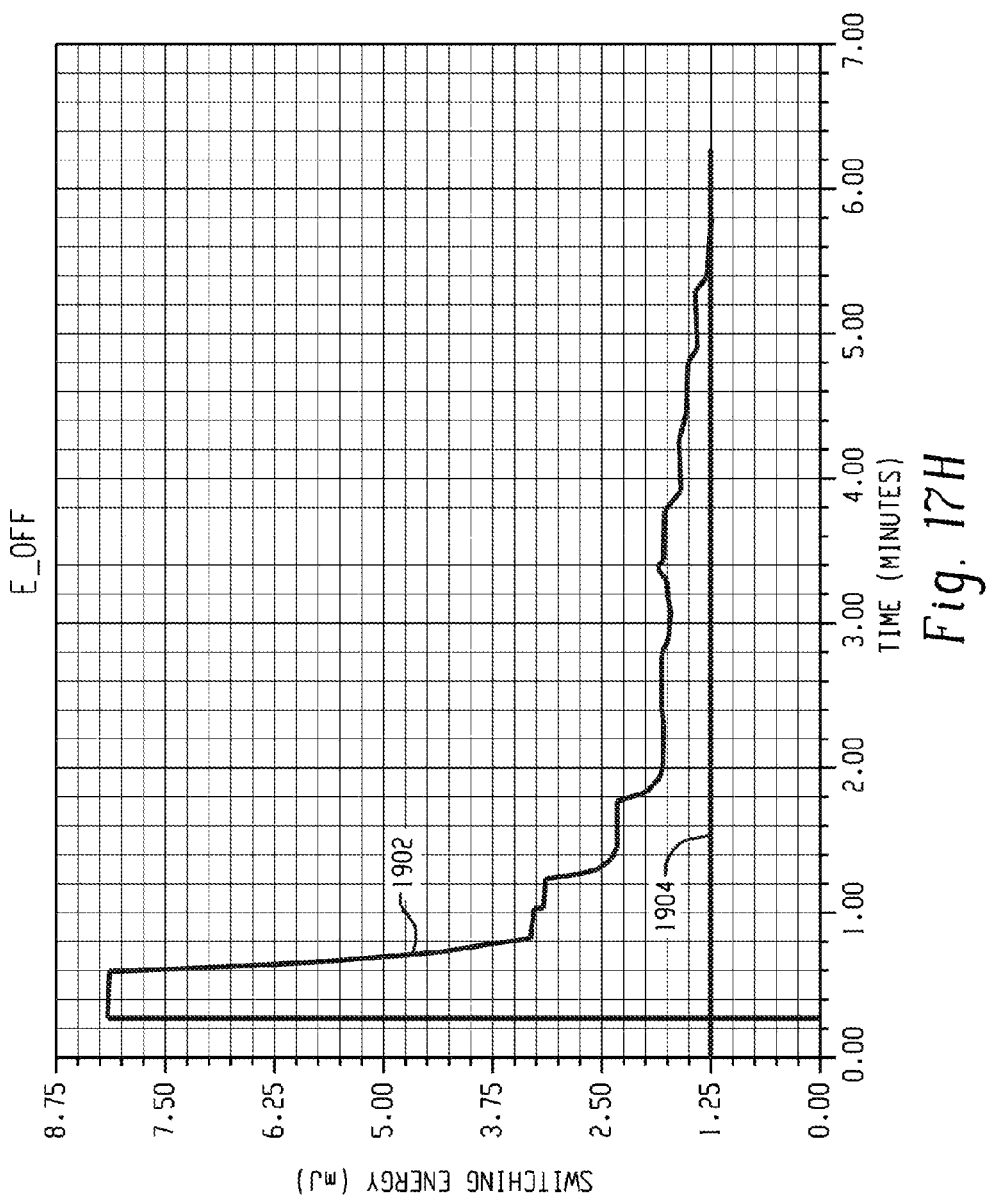
Figure 17I:
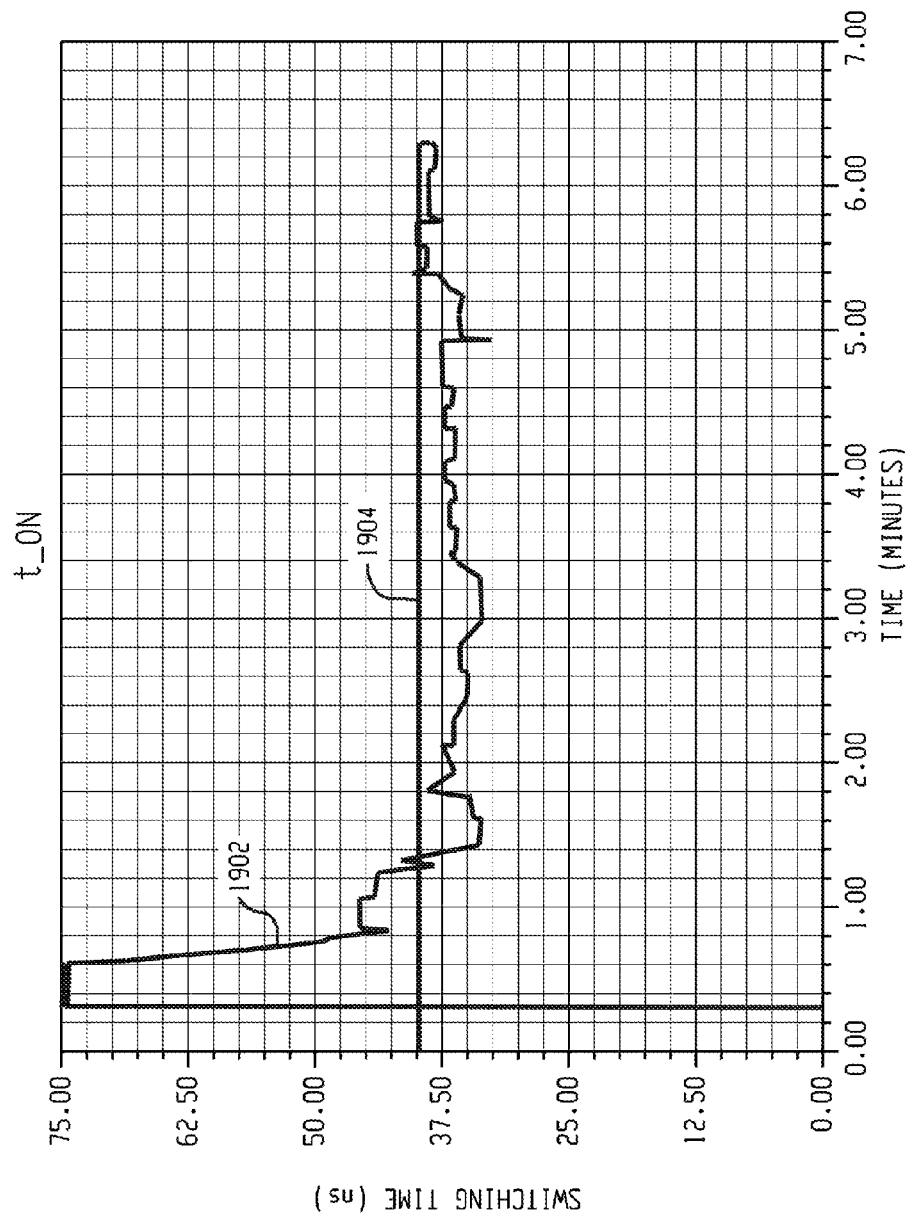
Figure 17J:
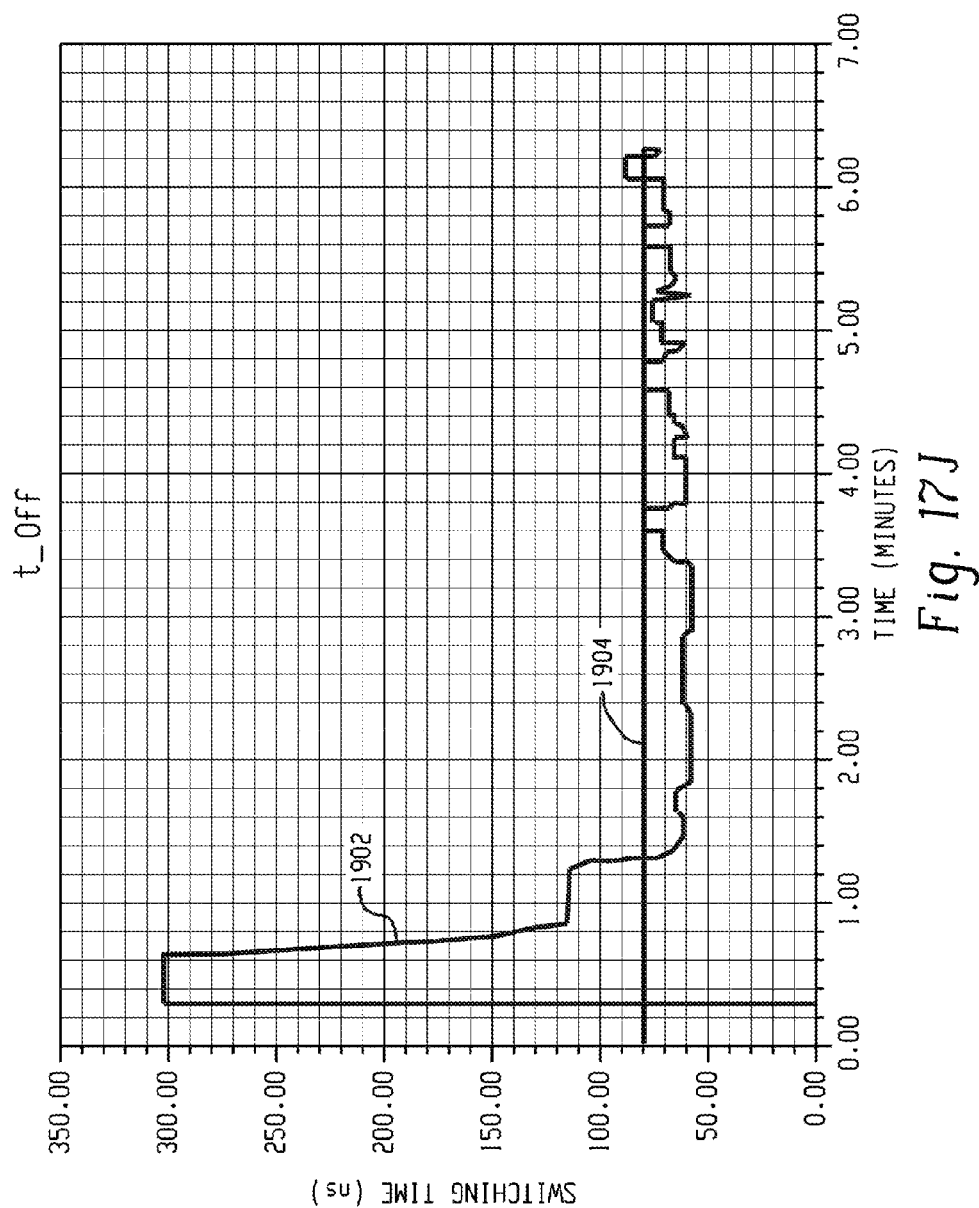

Another issue that may influence the measurement accuracy is the step size of the numerical simulation. Simulation results comprise a set of discrete datapoints, and the step size is adaptively adjusted by solver. To decouple the step size from measurement error, linear interpolation is performed between simulation data points so that all measurements are analog. FIG. 17C shows an example of simulation results of "on" switch waveforms following the post-processing described above. The step function line 1702 marks out the start and end point of $E_{ON}$ measurement.

FIGS. 17D-K illustrate aspects of an exemplary user interface (UI) that may be used with the systems and methods described herein. The step-by-step, streamlined UI may assist the user in utilizing the model correctly and easily. The UI may include the input panel described above with reference to FIG. 17B (e.g., enabling switching time and energy definitions to be input). The UI may further include a "test conditions" inputs panel, an example of which is depicted in FIG. 17D. Multiple test circuits and load types can be specified in the test conditions input panel to cover setups used by different manufacturers. In the approaches described herein, the determination of parameters of the power MOSFET model may then begin with DC curve fittings (transfer, output, diode) and thermal impedance fittings, as described above. A transfer curve fitting panel and fitting results display are shown in FIG. 17E. A separate log file may also be provided. The last step in the extracting of the model's parameters is the dynamic parameters extraction performed via a panel shown in FIG. 17F. The panel of FIG. 17F may be referred to as a "dynamic model input panel." During and after the parameter extraction procedure, the user can check the progress by clicking "Show Log" in the dynamic model input panel. This will open the "Fitting Info" window shown in FIG. 17G, and in this window, the user can view progress plots E_OFF, E_ON, t_ON, t_OFF, and residue (resGLOB) by selecting these plots under the "Progress" menu header. Examples of progress plots for E_ON, E_OFF, t_ON, t_OFF, and Residue are shown in FIGS. 17G-17K, respectively. The progress plots show how each goal value in G converges to its respective datasheet value as the model parameters are optimized during the procedure described above with reference to FIGS. 10-13.

Figure 17K:
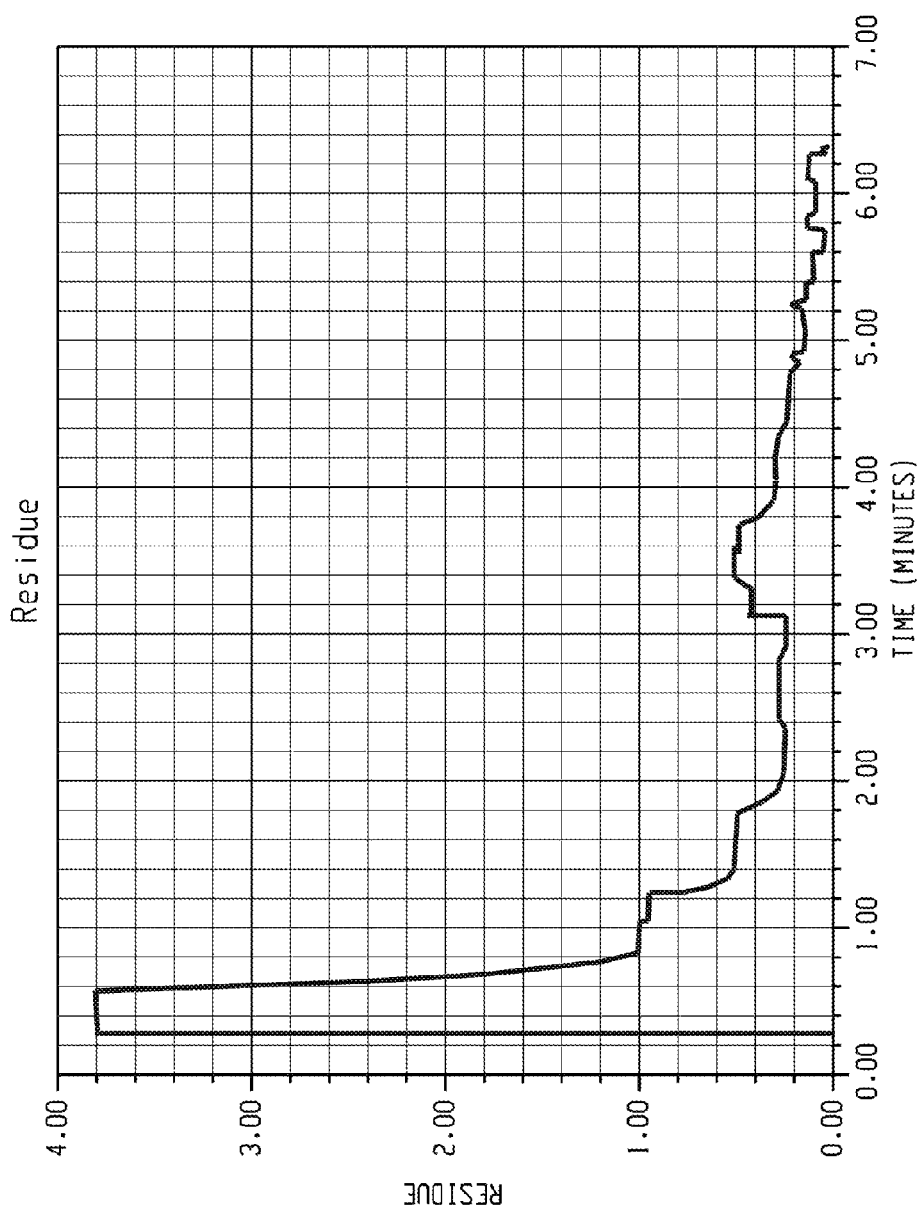

In the progress plots (e.g., the example progress plots shown in FIGS. 17G-17K), the x-axis shows the time used for dynamic extraction. E_ON, E_OFF, t_ON and t_OFF are the four dynamic characteristics. In the progress plots shown in FIGS. 17G-17J, the line 1902 is the measured simulation value G_SIM, and the line 1094 is the datasheet value G_DATA. The measured values change at each iteration of the numerical parameter searching. As the optimization proceeds, the measured values approach closer to their respective datasheet values, and the numerical search stops when all four goal values are within an error tolerance set by the user. The global residue resGLOB (e.g., an example plot of which is shown in FIG. 17K) is the weighted sum of all errors, in order to show the user the overall dynamic fitting progress. At the end of the extraction, this residue value converges to zero.

After the parameter extraction procedure is completed, the resulting model can be used as a single component in a blank schematic, or an automatically generated switching test circuit (e.g., as illustrated in FIGS. 11 and 12) can be used with the model. The test circuit configuration is designed to be the same as the one used during the characterization process of the real-world semiconductor device on which the model is based.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A computer-implemented method of determining parameters of a power MOSFET model, the model comprising static parameters and dynamic parameters, the method comprising:

receiving data for a semiconductor device, the data including
  (i) first data related to characteristics of the device in a steady-state operation, and
  (ii) second data related to transient-response characteristics of the device;
fitting variables of one or more functions to the first data to determine static parameters of a power MOSFET model;
executing a computer simulation to determine transient-response characteristics of the model as configured with the static parameters and a current set of dynamic parameters, the simulation generating a set of values indicative of the model's transient-response characteristics;
determining an error value indicating a difference between the set of values and the second data;
based on a determination that the error value is less than or equal to a threshold, setting dynamic parameters of the model equal to the current set of dynamic parameters; and
based on a determination that the error value is greater than the threshold:
  for each of the dynamic parameters of the model, executing a set of computer simulations in which a value of the dynamic parameter in the model is varied over the set of simulations while holding constant values of other dynamic parameters in the model, and
  adjusting values of the current set of dynamic parameters based on the error value and results of the sets of computer simulations;
wherein the power MOSFET model is provided for manufacturing the semiconductor device.

2. The computer-implemented method of claim 1, wherein the data for the semiconductor device is data from a datasheet for the device.

3. The computer-implemented method of claim 2, wherein the static and dynamic parameters of the power MOSFET model are determined using only the data from the datasheet, and wherein material-related and structure-related data is not used in determining the static and dynamic parameters.

4. The computer-implemented method of claim 1, wherein the execution of the sets of computer simulations generates a set of sensitivity coefficients, each sensitivity coefficient indicating an effect that varying a dynamic parameter has on a transient-response characteristic of the model.

5. The computer-implemented method of claim 1, wherein based on the determination that the error value is greater than the threshold, the method further comprises:
  determining a second set of values indicative of the model's transient-response characteristics as configured with the adjusted current set of dynamic parameters; and
  determining a second error value indicating a difference between the second set of values and the second data, wherein the dynamic parameters of the model are set equal to the adjusted current set of dynamic parameters or adjusted further based on the second error value.

6. The computer-implemented method of claim 1, wherein the static parameters cause the model to have characteristics in a steady-state operation that correspond to those of the semiconductor device, and wherein the dynamic parameters cause the model to have transient-response characteristics that correspond to those of the semiconductor device.

7. The computer-implemented method of claim 1, wherein the static parameters cause the power MOSFET model to have transfer characteristics, output characteristics, diode forward characteristics, and thermal characteristics that correspond to those of the semiconductor device.

8. The computer-implemented method of claim 1, wherein the computer simulation to determine the transient-response characteristics of the model comprises a transient analysis performed using a test circuit that is configured to provide control signals for switching a state of the power MOSFET model.

9. The computer-implemented method of claim 1, wherein the second data includes (i) an $E_{ON}$ value representing an energy loss in switching the device from an off state to an on state, (ii) an $E_{OFF}$ value representing an energy loss in switching the device from the on state to the off state, (iii) a $T_{ON}$ value representing a time elapsed in switching the device from the off state to the on state, and (iv) a $T_{OFF}$ value representing a time elapsed in switching the device from the on state to the off state.

10. The computer-implemented method of claim 9, wherein the set of values indicative of the model's transient-response characteristics includes $E_{ON}$, $E_{OFF}$, $T_{ON}$, and $T_{OFF}$ Values for the model.

11. The computer-implemented method of claim 1, wherein the first data includes (i) a transfer curve defining a transfer characteristic of the device, (ii) an output curve defining an output characteristic of the device, (iii) a diode curve defining a diode characteristic of the device, and (iv) a thermal curve defining a thermal characteristic of the device.

12. The computer-implemented method of claim 1, wherein the error value is based on $$Z = G_{SIM}(P, wp) - G_{DATA}(wp),$$

where Z is the error value, $G_{SIM}(P, wp)$ is a vector comprising the set of values generated via the execution of the computer simulation, P is a vector including the current set of dynamic parameters, $G_{DATA}(WP)$ is a vector comprising the second data, and wp is a working point comprising current, voltage, and temperature values on which the $G_{SIM}$ and $G_{DATA}$ vectors are based,
  wherein values of the vector $G_{SIM}(P, wp)$ include (i) an $E_{ON}$ value representing an energy loss in switching the model from an off state to an on state, (ii) an $E_{OFF}$ value representing an energy loss in switching the model from the on state to the off state, (iii) a $T_{ON}$ value representing a time elapsed in switching the model from the off state to the on state, and (iv) a $T_{OFF}$ value representing a time elapsed in switching the model from the on state to the off state, and
  wherein the second data of the vector $G_{DATA}(Wp)$ includes $E_{ON}$, $E_{OFF}$, $T_{ON}$, and $T_{OFF}$ values for the device as determined from the data for the semiconductor device.

13. The computer-implemented method of claim 12, wherein the execution of the sets of computer simulations for each of the dynamic parameters generates a matrix J:

$$(J) = \begin{pmatrix} \frac{\partial E_{ON}}{\partial C_{IN0}} & \frac{\partial E_{ON}}{\partial C_{IN1}} & \frac{\partial E_{ON}}{\partial C_{R0}} & \frac{\partial E_{ON}}{\partial C_{R1}} & \frac{\partial E_{ON}}{\partial \tau_{FD}} & \frac{\partial E_{ON}}{\partial \tau_{TAIL}} \\ \frac{\partial E_{OFF}}{\partial C_{IN0}} & \frac{\partial E_{OFF}}{\partial C_{IN1}} & \frac{\partial E_{OFF}}{\partial C_{R0}} & \frac{\partial E_{OFF}}{\partial C_{R1}} & \frac{\partial E_{OFF}}{\partial \tau_{FD}} & \frac{\partial E_{OFF}}{\partial \tau_{TAIL}} \\ \frac{\partial T_{on}}{\partial C_{IN0}} & \frac{\partial T_{on}}{\partial C_{IN1}} & \frac{\partial T_{on}}{\partial C_{R0}} & \frac{\partial T_{on}}{\partial C_{R1}} & \frac{\partial T_{on}}{\partial \tau_{FD}} & \frac{\partial T_{on}}{\partial \tau_{TAIL}} \\ \frac{\partial T_{off}}{\partial C_{IN0}} & \frac{\partial T_{off}}{\partial C_{IN1}} & \frac{\partial T_{off}}{\partial C_{R0}} & \frac{\partial T_{off}}{\partial C_{R1}} & \frac{\partial T_{off}}{\partial \tau_{FD}} & \frac{\partial T_{off}}{\partial \tau_{TAIL}} \end{pmatrix},$$

where each value of the matrix J is a sensitivity coefficient, each sensitivity coefficient indicating an effect that varying a dynamic parameter has on a transient-response characteristic of the model, wherein the dynamic parameters of the model include (i) capacitance values $C_{IN0}$ and $C_{IN1}$ used to model a parasitic gate-source capacitance of the model, (ii) capacitance values $C_{R0}$ and $C_{R1}$ used to model a parasitic drain-gate capacitance of the model, (iii) $\tau_{FD}$ representing an ambipolar life time of a free wheel diode junction of the model, and (iv) $\tau_{TAIL}$ representing a tail current time constant of the model.

14. The computer-implemented method of claim 13, further comprising:
based on a determination that the semiconductor device is a silicon carbide (SiC) power MOSFET device, placing maximum value limits on the $\tau_{FD}$, $\tau_{TAIL}$, $\tau_S$, and $\delta_T$ dynamic parameters of the model, wherein the dynamic parameter $\tau_S$ is a storage time constant in the model, and wherein the dynamic parameter $\delta_T$ is a tail current magnitude in the model.

15. The computer-implemented method of claim 13, wherein in the executing of the set of computer simulations in which the value of the dynamic parameter is varied over the set of simulations, values for a single column of the matrix J are determined.

16. The computer-implemented method of claim 13, wherein the adjusting of the values of the current set of dynamic parameters comprises solving an equation $$J^T J dP = -J^T Z,$$

where the values of the current set of dynamic parameters are adjusted based on a vector dP.

17. The computer-implemented method of claim 1, wherein the executing of the set of computer simulations in which the value of the dynamic parameter in the model is varied over the set of simulations while holding constant values of other dynamic parameters in the model comprises:
determining a sweeping step $\Delta P_i$ for the dynamic parameter,
executing four simulations using four values for the dynamic parameter, the four values being $P_{i,min}$, $P_{i,min} + \Delta P_i$, $P_{i,min} + 2\Delta P_i$, and $P_{i,max}$, wherein an analysis range based on $P_{i,min}$ and $P_{i,max}$ is adaptively determined based on a current value of the dynamic parameter $P_i$, and $$\Delta P_i = (P_{i,max} - P_{i,min})/3,$$

each of the four simulations generating a vector $G_{SIM}$ including values indicative of the model's transient-response characteristics;
for each element $G_j$ in $G_{SIM}$, performing a parabola fitting over simulation data points to obtain a parabolic function $G_j(P_i)$; and
calculating a first derivative of the parabolic function $G_j(P_i)$ at the current value $P_i$ to determine an element on the j-th row and i-th column of J.

18. The computer-implemented method of claim 1, wherein the determining of the current set of dynamic parameters comprises an initialization procedure in which initial estimates of the dynamic parameters are determined, one or more of the initial estimates being based on the data for the semiconductor device, the data for the semiconductor device being data from a datasheet for the semiconductor device.

19. The computer-implemented method of claim 1, wherein the determining of the current set of dynamic parameters comprises:
executing multiple computer simulations in which a value of a dynamic parameter in the model is varied over the multiple simulations while holding constant values of other dynamic parameters in the model, wherein each of the multiple computer simulations generates a set of values indicative of the model's transient-response characteristics;
for each of the multiple simulations, determining a second error value indicating a difference between a single value of the set of values and a single datum of the second data; and
determining a value of the dynamic parameter in the current set of dynamic parameters that minimizes the second error value, wherein other error values are not considered in the determining of the value in the current set of dynamic parameters.

20. A system for determining parameters of a power MOSFET model, the model comprising static parameters and dynamic parameters, the system comprising:
a processing system; and
computer-readable memory in communication with the processing system encoded with instructions for commanding the processing system to execute steps comprising:
receiving data for a semiconductor device, the data including
(i) first data related to characteristics of the device in a steady-state operation, and
(ii) second data related to transient-response characteristics of the device;
fitting variables of one or more functions to the first data to determine static parameters of a power MOSFET model;
executing a computer simulation to determine transient-response characteristics of the model as configured with the static parameters and a current set of dynamic parameters, the simulation generating a set of values indicative of the model's transient-response characteristics;
determining an error value indicating a difference between the set of values and the second data;
based on a determination that the error value is less than or equal to a threshold, setting dynamic parameters of the model equal to the current set of dynamic parameters; and
based on a determination that the error value is greater than the threshold:
for each of the dynamic parameters of the model, executing a set of computer simulations in which a value of the dynamic parameter in the model is varied over the set of simulations while holding constant values of other dynamic parameters in the model, and
adjusting values of the current set of dynamic parameters based on the error value and results of the sets of computer simulations;

wherein the power MOSFET model is provided for manufacturing the semiconductor device.

21. A non-transitory computer-readable storage medium for determining parameters of a power MOSFET model, the model comprising static parameters and dynamic parameters, the computer-readable storage medium comprising computer executable instructions which, when executed, cause a processing system to execute steps comprising:
   receiving data for a semiconductor device, the data including
     (i) first data related to characteristics of the device in a steady-state operation, and
     (ii) second data related to transient-response characteristics of the device;
   fitting variables of one or more functions to the first data to determine static parameters of a power MOSFET model;
   executing a computer simulation to determine transient-response characteristics of the model as configured with the static parameters and a current set of dynamic parameters, the simulation generating a set of values indicative of the model's transient-response characteristics;
   determining an error value indicating a difference between the set of values and the second data;
   based on a determination that the error value is less than or equal to a threshold, setting dynamic parameters of the model equal to the current set of dynamic parameters; and
   based on a determination that the error value is greater than the threshold:
     for each of the dynamic parameters of the model, executing a set of computer simulations in which a value of the dynamic parameter in the model is varied over the set of simulations while holding constant values of other dynamic parameters in the model, and
     adjusting values of the current set of dynamic parameters based on the error value and results of the sets of computer simulations;
   wherein the power MOSFET model is provided for manufacturing the semiconductor device.

\* \* \* \* \*